(12) United States Patent
Park

(10) Patent No.: US 9,734,910 B1
(45) Date of Patent: Aug. 15, 2017

(54) NONVOLATILE MEMORY CELLS HAVING LATERAL COUPLING STRUCTURES AND NONVOLATILE MEMORY CELL ARRAYS INCLUDING THE SAME

(71) Applicant: SK hynix Inc., Gyeonggi-do (KR)

(72) Inventor: Sung Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/239,689

(22) Filed: Aug. 17, 2016

(30) Foreign Application Priority Data

Jan. 22, 2016 (KR) .................. 10-2016-0008354
May 17, 2016 (KR) .................. 10-2016-0060451

(51) Int. Cl.
*G11C 16/04* (2006.01)
*G11C 16/06* (2006.01)
*H01L 27/11521* (2017.01)

(52) U.S. Cl.
CPC .......... *G11C 16/0408* (2013.01); *G11C 16/06* (2013.01); *H01L 27/11521* (2013.01)

(58) Field of Classification Search
None
See application file for complete search history.

(56) References Cited

U.S. PATENT DOCUMENTS

| | | |
|---|---|---|
| 7,894,257 B1 | 2/2011 | Prabhakar |
| 2007/0069278 A1 | 3/2007 | Bouchakour et al. |
| 2009/0141155 A1* | 6/2009 | Ellis-Monaghan ......... H04N 5/35527 348/308 |
| 2010/0245307 A1* | 9/2010 | Kimura .................... G09G 3/20 345/206 |
| 2015/0303208 A1* | 10/2015 | Kim .................. H01L 27/11524 257/300 |

* cited by examiner

*Primary Examiner* — Son Dinh
*Assistant Examiner* — Uyen B Tran
(74) *Attorney, Agent, or Firm* — IP & T Group LLP

(57) ABSTRACT

A nonvolatile memory (NVM) cell includes a selection transistor configured to have a selection gate terminal coupled to a word line and a source terminal coupled to a source line, a cell transistor configured to have a floating gate electrically isolated, a drain terminal coupled to a bit line and sharing a junction terminal with the selection transistor, a first coupling capacitor disposed in a first connection line coupled between the word line and the floating gate, and a P-N diode and a second coupling capacitor disposed in series in a second connection line coupled between the word line and the floating gate. An anode and a cathode of the P-N diode are coupled to the second coupling capacitor and the word line, respectively. The first and second connection lines are coupled in parallel between the word line and the floating gate.

5 Claims, 32 Drawing Sheets

NONVOLATILE MEMORY CELLS HAVING LATERAL COUPLING STRUCTURES AND NONVOLATILE MEMORY CELL ARRAYS INCLUDING THE SAME

CROSS-REFERENCE TO RELATED APPLICATIONS

The present application claims priority under 35 U.S.C 119(a) to Korean Patent Application Nos. 10-2016-0008354 and 10-2016-0060451, filed on Jan. 22, 2016 and May 17, 2016, respectively, which are herein incorporated by reference in their entirety.

BACKGROUND

1. Technical Field

Various embodiments of the present disclosure relate generally to nonvolatile memory cells and, more particularly, to nonvolatile memory cells having a lateral coupling structure and nonvolatile memory cell arrays including the same.

2. Related Art

Electrically erasable programmable read only memory (EEPROM) devices and flash memory devices belong to nonvolatile memory (NVM) devices that retain their stored data even when their power supplies are interrupted. Various memory cell structures of the NVM devices have been proposed to improve their performance. A typical unit memory cell of the NVM devices employs a stack gate structure including a floating gate, an inter-gate dielectric layer and a control gate which are sequentially stacked on a semiconductor substrate. As electronic systems become smaller with the development of fabrication techniques for semiconductor devices, system-on-chip (SOC) products have been developed and utilized as important devices for high performance digital systems. Each of the SOC products may include a plurality of semiconductor devices executing various functions in a single chip. For example, the SOC product may include at least one logic device and at least one memory device which are integrated into a single chip. Thus, fabrication technologies for embedded NVM devices may be required to embed the NVM devices into the SOC products.

To embed the NVM devices in the SOC products, the process technology of the NVM devices has to be compatible with the process technology of the logic device included in the SOC products. In general, the logic devices employ transistors having a single gate structure, whereas the NVM devices employ cell transistors having a stack gate structure that is, a double gate structure. Thus, the SOC products including the NVM devices and the logic devices may require a complicated process technology. Accordingly, single-layered gate NVM devices employing a single-layered gate cell structure are very attractive as a candidate for the embedded NVM devices. That is, complementary metal-oxide-semiconductor (CMOS) circuits of the logic devices may be readily realized using a process technology of the single-layered gate NVM devices. As a result, the process technology of the single-layered gate NVM devices may be widely used in fabrication of the SOC products including embedded NVM devices.

SUMMARY

Various embodiments are directed to NVM cells having a lateral coupling structure and NVM cell arrays including the NVM cells.

According to an embodiment, a nonvolatile memory cell includes a selection transistor configured to have a selection gate terminal coupled to a word line and a source terminal coupled to a source line, a cell transistor configured to have a floating gate electrically isolated, a drain terminal coupled to a bit line and sharing a junction terminal with the selection transistor, a first coupling capacitor disposed in a first connection line coupled between the word line and the floating gate, and a P-N diode and a second coupling capacitor disposed in series in a second connection line coupled between the word line and the floating gate. An anode and a cathode of the P-N diode are coupled to the second coupling capacitor and the word line, respectively. The first and second connection lines are coupled in parallel between the word line and the floating gate.

According to another embodiment, a nonvolatile memory cell includes a first active region extending in a first direction, first to third junction regions of a first conductivity type disposed in the first active region, a floating gate intersecting a first region of the first active region and extending in a second direction, a selection gate intersecting a second region of the first active region and extending in the second direction, and a dielectric layer disposed between the floating gate and the selection gate. The selection gate includes a first selection gate of the first conductivity type and a second selection gate of a second conductivity type that contact each other to constitute a junction structure.

According to another embodiment, a nonvolatile memory cell array includes a plurality of active regions extending in a first direction and arrayed spaced apart from each other in a second direction, a plurality of selection gates extending in the second direction and arrayed spaced apart from each other in the first direction, wherein each of the plurality of selection gates intersects the plurality of active regions, a plurality of floating gates disposed parallel to the plurality of selection gates, wherein each of the plurality of floating gates intersects only one of the plurality of active regions, and a dielectric layer disposed between each of the floating gates and the selection gate adjacent thereto. Each of the plurality of selection gates includes first selection gates of a first conductivity type and second selection gates of a second conductivity type which are alternately arrayed in the second direction.

According to another embodiment, a nonvolatile memory cell array includes a plurality of unit cells which are respectively located at cross points of rows distinguished by bit lines or source lines, and columns distinguished by word lines. Each of the plurality of unit cells comprising: a selection transistor configured to have a selection gate terminal coupled to a single word line of the word lines and a source terminal coupled to a single source line of the source lines, a cell transistor configured to have a floating gate electrically isolated and a drain terminal coupled to a single bit line of the bit lines and configured to share a junction terminal with the selection transistor, a first coupling capacitor disposed in a first connection line coupled between the selection gate terminal and the floating gate, and a P-N diode and a second coupling capacitor disposed in series in a second connection line coupled between the selection gate terminal and the floating gate. An anode and a cathode of the P-N diode are coupled to the second coupling capacitor and the selection gate terminal, respectively. The first and second connection lines are coupled in parallel between the selection gate terminal and the floating gate.

According to another embodiment, a nonvolatile memory cell includes a selection transistor configured to have a selection gate terminal coupled to both of a program word line and a read/erasure word line, and a source terminal coupled to a source line, a cell transistor configured to have a floating gate electrically isolated and a drain terminal coupled to a bit line and configured to share a junction terminal with the selection transistor, a first coupling capacitor disposed in a first connection line coupled between the word line and the floating gate, and a P-N diode and a second coupling capacitor disposed in series in a second connection line coupled between the word line and the floating gate. An anode of the P-N diode is coupled to the second coupling capacitor and the program word line. A cathode of the P-N diode is coupled to the selection gate terminal and the read/erasure word line and the first and second connection lines are coupled in parallel between the read/erasure word line and the floating gate.

According to another embodiment, a nonvolatile memory cell array includes a plurality of unit cells which are respectively located at cross points of rows distinguished by bit lines or source lines, and columns distinguished by program word lines or read/erasure word lines. Each of the plurality of unit cells comprises: a selection transistor configured to have a selection gate terminal coupled to both a single program word line of the program word lines and a single read/erasure word line of the read/erasure word lines, and a source terminal coupled to a single source line of the source lines, a cell transistor configured to have a floating gate electrically isolated and a drain terminal coupled to a single bit line of the bit lines and configured to share a junction terminal with the selection transistor, a first coupling capacitor disposed in a first connection line coupled between the single read/erasure word line and the floating gate, a P-N diode disposed in a second connection line coupled between the single program word line and the single read/erasure word line, and a second coupling capacitor disposed in the second connection line coupled between the single program word line and the floating gate. An anode of the P-N diode is coupled to the second coupling capacitor and the single program word line. A cathode of the P-N diode is coupled to the selection gate terminal and the single read/erasure word line and the first and second connection lines are coupled in parallel between the single read/erasure word line and the floating gate.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
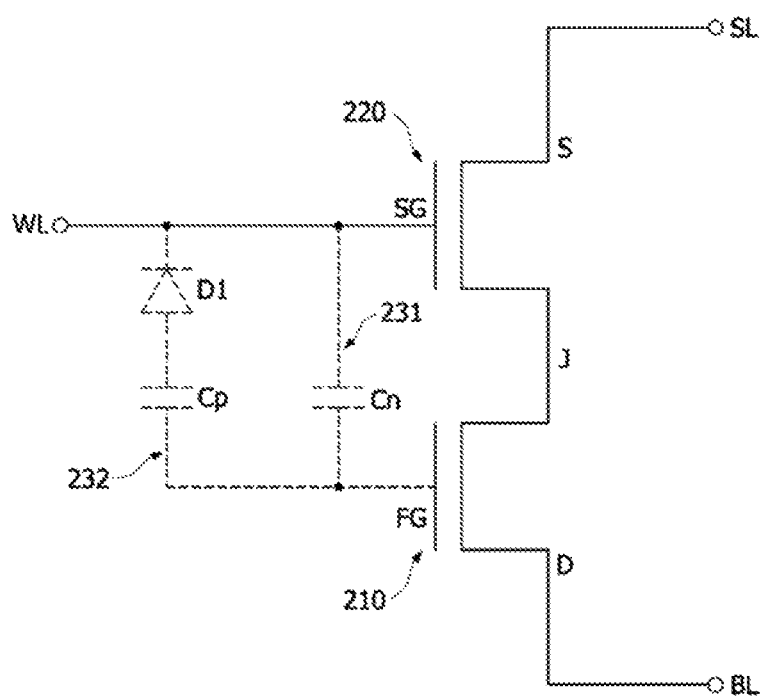
FIG. 1 is an equivalent circuit diagram illustrating a nonvolatile memory cell, according to an embodiment of the present disclosure.

Although the present disclosure is described in view of specific embodiments in reference to the accompanying drawings, it should be understood that the present disclosure may be embodied in various other forms, and should not be construed as being limited to the Illustrated embodiments only. Rather, these embodiments are provided as examples so that this disclosure will be thorough and complete, and will fully convey the present disclosure to those skilled in the art to which this disclosure pertains.

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

The drawings are not necessarily to scale and, in some instances, proportions may have been exaggerated to more clearly illustrate the various elements of the embodiments. For example, in the drawings, the size of elements and the intervals between elements may be exaggerated compared to actual sizes and intervals for convenience of illustration.

The terminology used herein is for the purpose of describing particular embodiments only and is not intended to be limiting of the present disclosure. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present disclosure belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth to provide a thorough understanding of the present disclosure. The present disclosure may be practiced without some or all of these specific details. In other instances, well-known process structures and/or processes have not been described in detail in order not to unnecessarily obscure the present disclosure.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present disclosure will be described in detail with reference to the attached drawings.

FIG. 1 is an equivalent circuit diagram of a nonvolatile memory (NVM) cell 200, according to an embodiment of the present disclosure. Referring to FIG. 1, the NVM cell 200 may be configured to include a cell transistor 210 and a selection transistor 220. In some embodiments, each of the cell transistor 210 and the selection transistor 220 may be realized to have a structure of an N-channel MOS transistor. The cell transistor 210 may have a floating gate FG and a drain terminal D coupled to a bit line BL. The selection transistor 220 may have a selection gate terminal SG coupled to a word line WL and a source terminal S coupled to a source line SL. The cell transistor 210 and the selection transistor 220 may share a junction terminal J with each other. The junction terminal J may correspond to a source terminal of the cell transistor 210 as well as a drain terminal of the selection transistor 220. A first coupling capacitor Cn may exist between the selection gate terminal SG the floating gate FG. Both electrodes of the first coupling capacitor Cn may be connected to the selection gate terminal SG and the floating gate FG through a first connection line 231, respectively. A P-N diode D1 and a second coupling capacitor Cp may be coupled in series between the selection gate terminal SG and the floating gate FG. The P-N diode D1 and a second coupling capacitor Cp may be connected to the selection gate terminal SG and the floating gate FG through a second connection line 232, respectively. The first and second connection lines 231 and 232 may be coupled in parallel between the selection gate terminal SG and the floating gate FG. Thus, the first and second coupling capacitors Cn and Cp may also be coupled in parallel between the selection gate terminal SG and the floating gate FG. A capacitance value of the first coupling capacitor Cn may be different from a capacitance value of the second coupling capacitor Cp. The first coupling capacitor Cn may have a capacitance which is greater than a capacitance of the second coupling capacitor Cp. An anode and a cathode of the P-N diode D1 may be connected to the second coupling capacitor Cp and the word line WL, respectively.

If a positive bias having a certain voltage is applied to the selection gate terminal SG through the word line WL, a reverse bias may be applied to the P-N diode D1 to provide an open circuit between the word line WL and the second coupling capacitor Cp. Thus, a coupling bias having a certain voltage may be induced at the floating gate FG by the first coupling capacitor Cn. In such a case, a coupling voltage induced at the floating gate FG may be influenced by a first coupling ratio that relates to the first coupling capacitor Cn. In contrast, if a negative bias having a certain voltage is applied to the selection gate terminal SG through the word line WL, a forward bias may be applied to the P-N diode D1 to provide a short circuit between the word line WL and the second coupling capacitor Cp. Thus, a coupling bias having a certain voltage may be induced at the floating gate FG by both of the first and second coupling capacitors Cn and Cp. In such a case, a coupling voltage induced at the floating gate FG may be influenced by a second coupling ratio relating to the second coupling capacitor Cp in addition to the first coupling ratio relating to the first coupling capacitor Cn.

In general, a threshold voltage variation $\Delta VT$ of the cell transistor 210 may be defined by the following equation 1.

$$\Delta VT = \Delta Q / C\text{coupling} \quad \text{(Equation 1)}$$

where, "$\Delta Q$" denotes an electric charge variation at the floating gate FG of the cell transistor 210, and "Ccoupling" denotes a capacitance value between the floating gate FG of the cell transistor 210 and the selection gate terminal SG of the selection transistor 220. As expressed by the equation 1, when the electric charge variation $\Delta Q$ at the floating gate FG is constant, the threshold voltage variation $\Delta VT$ of the cell transistor 210 may be reduced if the capacitance value Ccoupling between the floating gate FG and the selection gate terminal SG increases. In contrast, when the electric charge variation $\Delta Q$ at the floating gate FG is constant, the threshold voltage variation $\Delta VT$ of the cell transistor 210 may increase if the capacitance value Ccoupling between the floating gate FG and the selection gate terminal SG is reduced.

As described above, in the NVM cell, according to an embodiment, a cell coupling ratio used in calculation of a coupling voltage induced at the floating gate FG may be different according to a polarity of the bias voltage applied to the word line WL. Since both of the cell transistor 210 and the selection transistor 220 are realized using N-channel MOS transistors, the program operation and the read operation may be performed by applying a positive bias voltage to the word line WL. In contrast, the erasure operation may be performed by applying a negative bias voltage to the word line WL. Accordingly, a cell coupling ratio for calculating a coupling bias voltage induced at the floating gate FG during the program operation or the read operation may be different from a cell coupling ratio for calculating a coupling bias voltage induced at the floating gate FG during the erasure operation. In particular, since both of the first and second coupling capacitors Cn and Cp directly influence a coupling operation between the floating gate FG and the selection gate terminal SG during the erasure operation, a cell coupling ratio of the NVM cell shown in FIG. 1 during the erasure operation may be higher than a cell coupling ratio of the NVM cell shown in FIG. 1 during the program operation or the read operation. The erasure operation may be achieved by a band-to-band tunneling (BTBT) mechanism. In general, a time it takes to induce a specific electric charge variation at a floating gate during an erasure operation using the BTBT mechanism may be much longer than a time it takes to induce the specific electric charge variation at the floating gate during a program operation using a hot electron injection (HEI) mechanism. For example, an erasure operation performed using the BTBT mechanism may take approximately 100 times as long as compared with a program operation using the HEI mechanism. However, according to the present embodiment, the second coupling capacitor Cp may additionally influence the coupling operation between the floating gate FG and the selection gate terminal SG during the erasure operation to increase the capacitance value Ccoupling of the equation 1. Thus, it may be possible to reduce an erasure time it takes to obtain the same threshold voltage variation $\Delta VT$. Moreover, during a read operation, only the first coupling capacitor Cn of the first and second coupling capacitors Cn and Cp may influence the coupling operation between the floating gate FG and the selection gate terminal SG to reduce the cell coupling ratio. As a result, an error range of the read operation according to the variation of the threshold voltage of the cell transistor may be reduced to suppress a read disturbance phenomenon.

Figure 2:
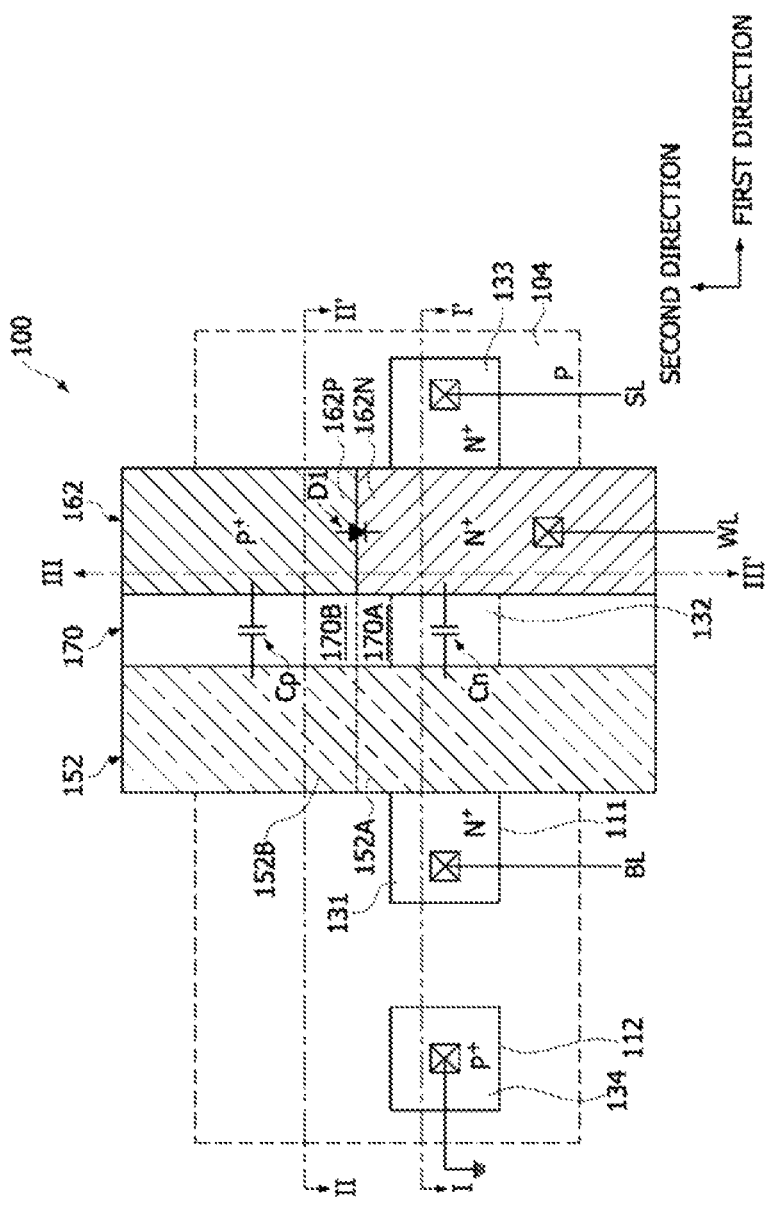
FIG. 2 is a layout diagram illustrating a nonvolatile memory cell, according to an embodiment of the present disclosure.
Figure 3:
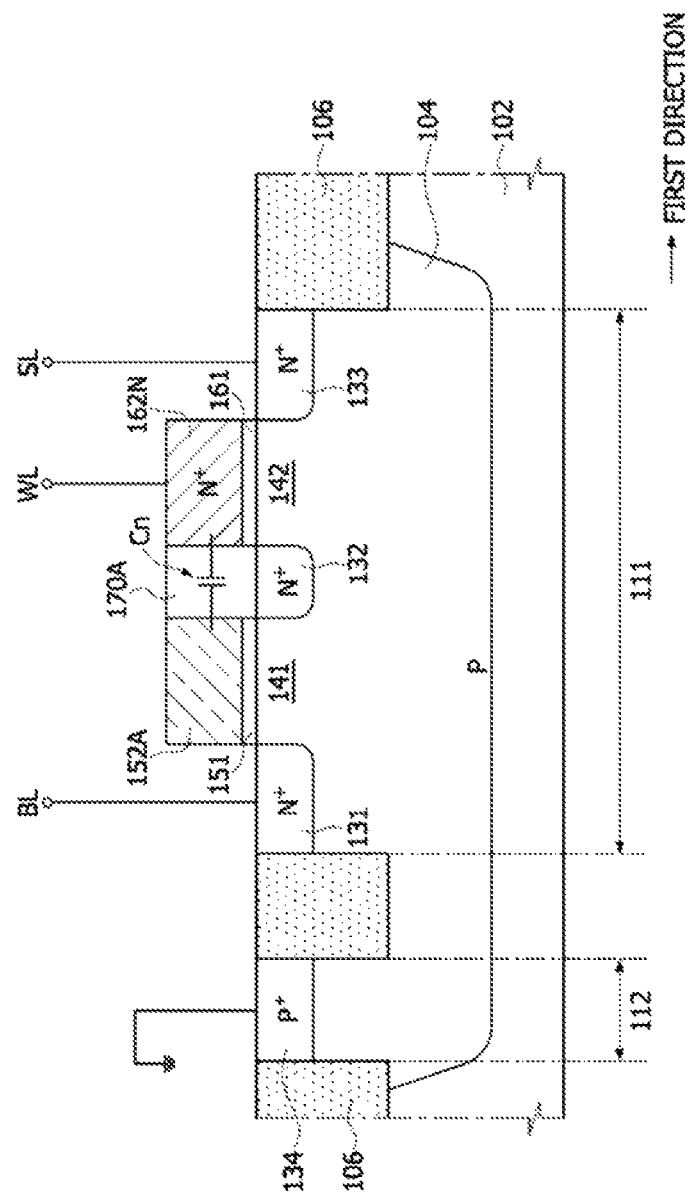
FIG. 3 is a cross-sectional view taken along a line I-I' of FIG. 2.
Figure 4:
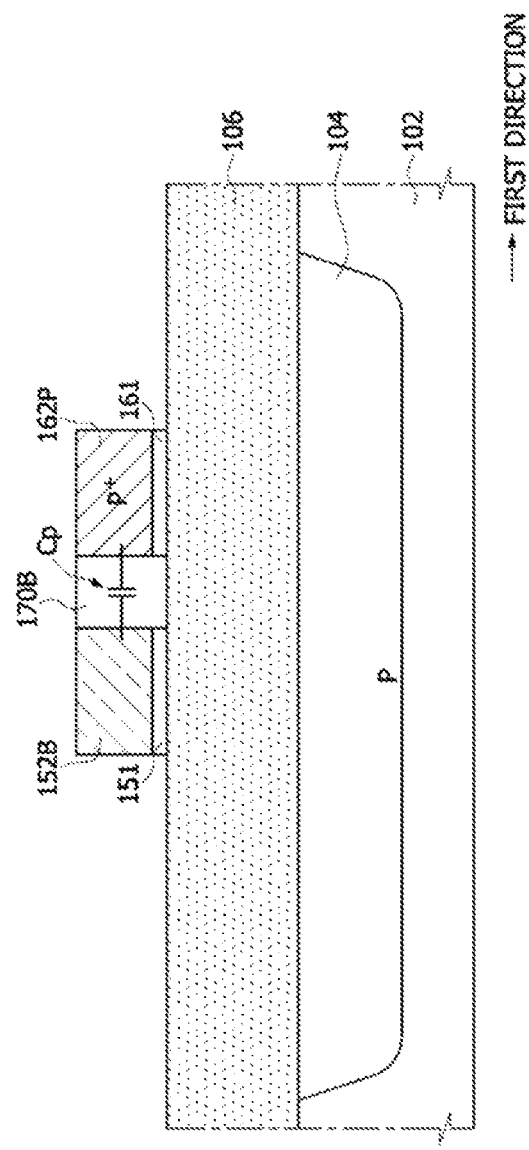
FIG. 4 is a cross-sectional view taken along a line II-II' of FIG. 2.
Figure 5:
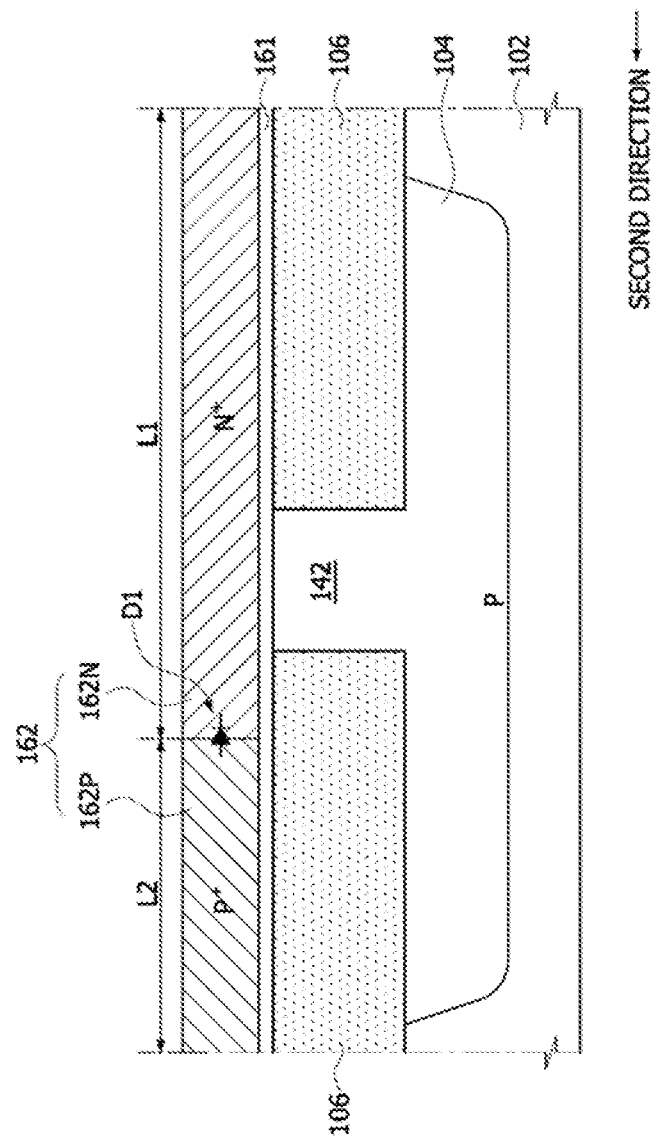
FIG. 5 is a cross-sectional view taken along a line III-III' of FIG. 2.

FIG. 2 is a layout diagram illustrating a nonvolatile memory cell 100, according to an embodiment of the present disclosure. FIGS. 3, 4 and 5 are cross-sectional views taken along lines I-I', II-II' and III-III' of FIG. 2, respectively. Referring to FIGS. 2 to 5, a P-type semiconductor region, for example, a P-type well region 104 may be disposed in an upper portion of a substrate 102. A trench isolation layer 106 may be disposed in an upper portion of the substrate 102 to define first and second active regions 111 and 112. The first and second active regions 111 and 112 may be disposed in the P-type well region 104. The first active region 111 may have a stripe shape extending in a first direction in a plane view whereas the second active region 112 may have a box shape in a plane view as illustrated in FIG. 2. The second active region 112 may be spaced apart from the first active region 111 in the first direction.

A first N-type junction region 131, a second N-type junction region 132 and a third N-type junction region 133 may be disposed in the first active region 111 spaced apart from each other in the first direction. In some embodiments, the first N-type junction region 131 and the third N-type junction region 133 may correspond to a drain region and a source region, respectively. The first N-type junction region 131 and the third N-type junction region 133 may be disposed in both ends of the first active region 111, respectively. The second N-type junction region 132 may be disposed between the first and third N-type junction regions 131 and 133. The second N-type junction region 132 may be spaced apart from the first N-type junction region 131 by a first channel region 141 in the first direction. The second N-type junction region 132 may be spaced apart from the third N-type junction region 133 by a second channel region 142 in the first direction. A P-type contact region 134 may be disposed in the second active region 112. The first N-type junction region 131 and the third N-type junction region 133 may be coupled to a bit line BL and a source line SL, respectively. The P-type contact region 134 may be grounded.

A floating gate 152 and a selection gate 162 may intersect the first active region 111. Each of the floating gate 152 and the selection gate 162 may have a stripe shape extending in a second direction intersecting the first direction in a plane view. The floating gate 152 and the selection gate 162 may be spaced apart from each other in the first direction. The floating gate 152 may overlap with the first channel region 141 of the first active region 111. The selection gate 162 may overlap with the second channel region 142 of the first active region 111. A first gate insulation layer 151 may be disposed between the floating gate 152 and the first channel region 141. A second gate insulation layer 161 may be disposed between the selection gate 162 and the second channel region 142. The floating gate 152 may be electrically isolated from other elements. That is, the floating gate 152 is not directly connected to other elements. In contrast, the selection gate 162 may be coupled to a word line WL. The floating gate 152 and the selection gate 162 may have a single polysilicon structure that is, a single-layered polysilicon gate structure that is comprised of a single polysilicon layer. That is, the floating gate 152 and the selection gate 162 may be comprised of the same polysilicon layer. A distance between the floating gate 152 and the selection gate 162 may be substantially uniform along the second direction. A dielectric layer 170 may be disposed between the floating gate 152 and the selection gate 162.

The selection gate 162 may include an N-type selection gate 162N and a P-type selection gate 162P which are arrayed in the second direction. A boundary between the N-type selection gate 162N and the P-type selection gate 162P may be located on the trench isolation layer 106 spaced apart from the first active region 111 by a certain distance. The N-type selection gate 162N may be disposed to extend from the boundary between the N-type selection gate 162N and the P-type selection gate 162P onto the second channel region 142. The P-type selection gate 162P may extend from the boundary between the N-type selection gate 162N and the P-type selection gate 162P in an opposite direction to the N-type selection gate 162N. Thus, the N-type selection gate 162N may intersect the first active region 111 in a plane view to overlap with the second channel region 142, and the P-type selection gate 162P may be located on the trench isolation layer 106 without overlapping with the first active region 111. As illustrated in FIG. 5, a first length L1 of the N-type selection gate 162N in the second direction may be greater than a second length L2 of the P-type selection gate 162P in the second direction. The N-type selection gate 162N may be coupled to the word line WL. Thus, the P-type selection gate 162P may be indirectly coupled to the word line WL through the N-type selection gate 162N. The P-type selection gate 162P and the N-type selection gate 162N may constitute a P-N diode D1. The P-type selection gate 162P and the N-type selection gate 162N may correspond to an anode and a cathode of the P-N diode D1, respectively. Thus, if a positive bias voltage is applied to the word line WL, the P-N diode D1 may be reverse-biased. In such a case, the positive bias voltage applied to the word line WL may be transmitted to the N-type selection gate 162N and may not be transmitted to the P-type selection gate 162P. In contrast, if a negative bias voltage is applied to the word line WL, the P-N diode D1 may be forward-biased. Accordingly, the negative bias voltage applied to the word line WL may be transmitted to both of the N-type selection gate 162N and the P-type selection gate 162P.

The floating gate 152 may include a first floating gate 152A and a second floating gate 152B. The dielectric layer 170 may include a first dielectric layer 170A and a second dielectric layer 170B. The first floating gate 152A and the first dielectric layer 170A may overlap with the N-type selection gate 162N in the first direction. The second floating gate 152B and the second dielectric layer 170B may overlap with the P-type selection gate 162P in the first direction. Thus, a boundary between the first and second floating gates 152A and 152B, a boundary between the first and second dielectric layers 170A and 170B, and a boundary between the N-type selection gate 162N and the P-type selection gate 162P may be located on a straight line parallel with the first direction. The first floating gate 152A, the first dielectric layer 170A and the N-type selection gate 162N, which are laterally stacked, may constitute a first coupling capacitor Cn. Similarly, the second floating gate 152B, the second dielectric layer 170B and the P-type selection gate 162P, which are laterally stacked, may constitute a second coupling capacitor Cp. Thus, the first coupling capacitor Cn and the second coupling capacitor Cp may constitute a total coupling capacitor comprised of the floating gate 152, the dielectric layer 170 and the selection gate 162, which are laterally stacked in the first direction.

The NVM cell 100 according to the present embodiment may be an example for realizing the equivalent circuit diagram 200 shown in FIG. 1. The first N-type junction region 131, the second N-type junction region 132, the first channel region 141, the first gate insulation layer 151 and the floating gate 152 may constitute the cell transistor 210 of FIG. 1. The first N-type junction region 131 and the second N-type junction region 132 may correspond to the drain terminal D and the junction terminal J of the cell transistor 210, respectively. The floating gate 152 may correspond to the floating gate FG of the cell transistor 210 shown in FIG. 1. The second N-type junction region 132, the third N-type junction region 133, the second channel region 142, the second gate insulation layer 161 and the selection gate 162 may constitute the selection transistor 220 shown in FIG. 1. The third N-type junction region 133 may correspond to the source terminal S of the selection transistor 220 shown in FIG. 1. The selection gate 162 may correspond to the selection gate terminal SG of the selection transistor 220 shown in FIG. 1.

Figure 6:
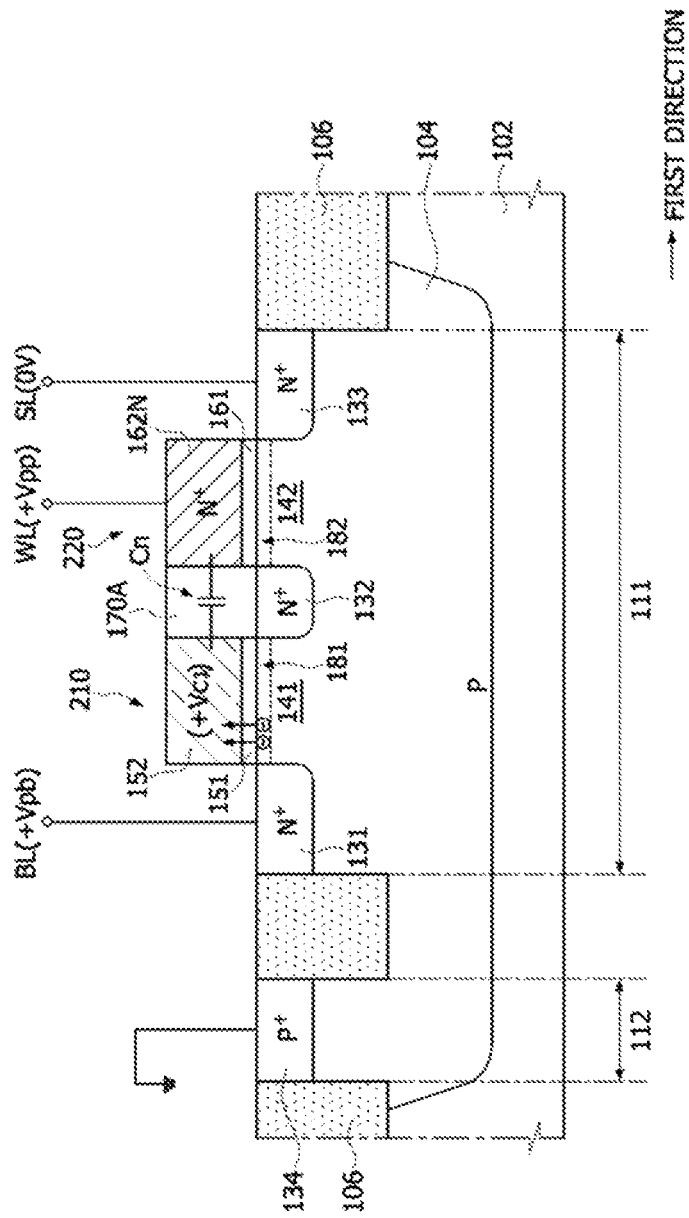
FIG. 6 is a cross-sectional view illustrating a program operation of a nonvolatile memory cell, according to an embodiment of the present disclosure.
Figure 7:
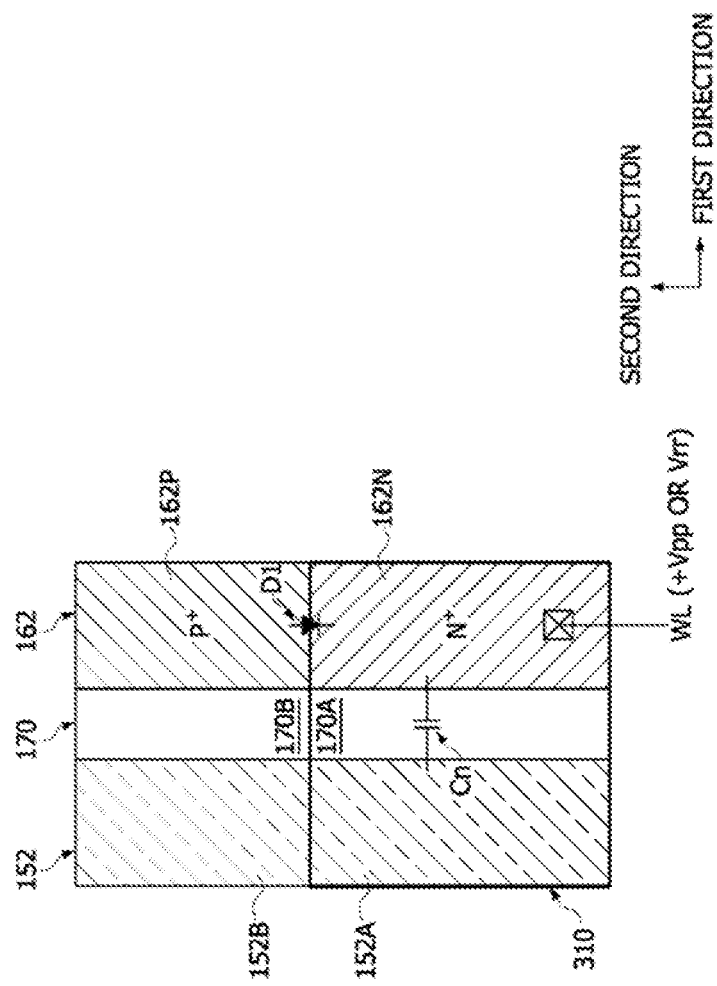
FIG. 7 is a plane view illustrating a coupling mechanism between a selection gate and a floating gate during a program operation of a nonvolatile memory cell, according to an embodiment of the present disclosure.

FIG. 6 is a cross-sectional view illustrating a program operation of a nonvolatile memory cell, according to an embodiment of the present disclosure, and FIG. 7 is a plane view illustrating a coupling mechanism between a selection gate and a floating gate during the program operation of the nonvolatile memory cell shown in FIG. 6. In FIG. 6, the same reference numerals or designators as used in FIG. 3 denote the same elements. The program operation according to the present embodiment may be performed using a hot electron injection (HEI) mechanism. Referring to FIG. 6, to execute the program operation of the NVM cell (corresponding to the NVM cell 100 shown in FIGS. 2-5), a positive program voltage +Vpp may be applied to the word line WL and a positive program bit line voltage +Vpb may be applied to the bit line BL. In addition, a ground voltage may be applied to the source line SL. In some embodiments, the positive program voltage +Vpp and the positive program bit line voltage +Vpb may be approximately +9 volts and approximately +4.5 volts, respectively. While the positive program voltage +Vpp is applied to the word line WL, an inversion layer 182 may be formed in the second channel region 142 between the second and third N-type junction regions 132 and 133. Thus, the selection transistor 220 may be turned on, and the ground voltage applied to the source line SL may be transmitted to the second N-type junction region 132 through the inversion layer 182.

As illustrated in FIG. 7, as the positive program voltage +Vpp is applied to the N-type selection gate 162N through the word line WL, the P-N diode D1 may be reverse-biased to act as an open circuit. Thus, the positive program voltage +Vpp may be applied only to the N-type selection gate 162N and may not be transmitted to the P-type selection gate 162P. Since the positive program voltage +Vpp is not transmitted to the P-type selection gate 162P, the second coupling capacitor Cp comprised of the second floating gate 152B, the second dielectric layer 170B and the P-type selection gate 162P cannot influence an electrical coupling between the floating gate 152 and the selection gate 162. Thus, during the program operation, a coupling voltage induced at the floating gate 152 may be influenced by the first coupling capacitor Cn (comprised of the first floating gate 152A, the first dielectric layer 170A and the N-type selection gate 162N) without the second coupling capacitor Cp, as indicated by a box 310 of FIG. 7. That is, the coupling voltage induced at the floating gate 152 may be determined by the positive program voltage +Vpp and a cell coupling ratio relating to the first coupling capacitor Cn without the second coupling capacitor Cp.

Referring again to FIG. 6, a positive coupling program voltage +Vc1 may be induced at the floating gate 152 under the above bias condition for the program operation, and an inversion layer 181 may be formed in the first channel region 141 between the first and second N-type junction regions 131 and 132. Accordingly, hot electrons may be generated in the inversion layer 181 adjacent to the first junction region 131, and the hot electrons generated in the inversion layer 181 may be injected into the floating gate 152 through the first gate insulation layer 151 due to a vertical electric field which is created by the positive coupling program voltage +Vc1 induced at the floating gate 152. As the hot electrons are injected into the floating gate 152, the NVM cell 100 may be programmed and a threshold voltage of the cell transistor 210 may become greater than an initial threshold voltage of the cell transistor 210 before the program operation is performed.

Figure 8:
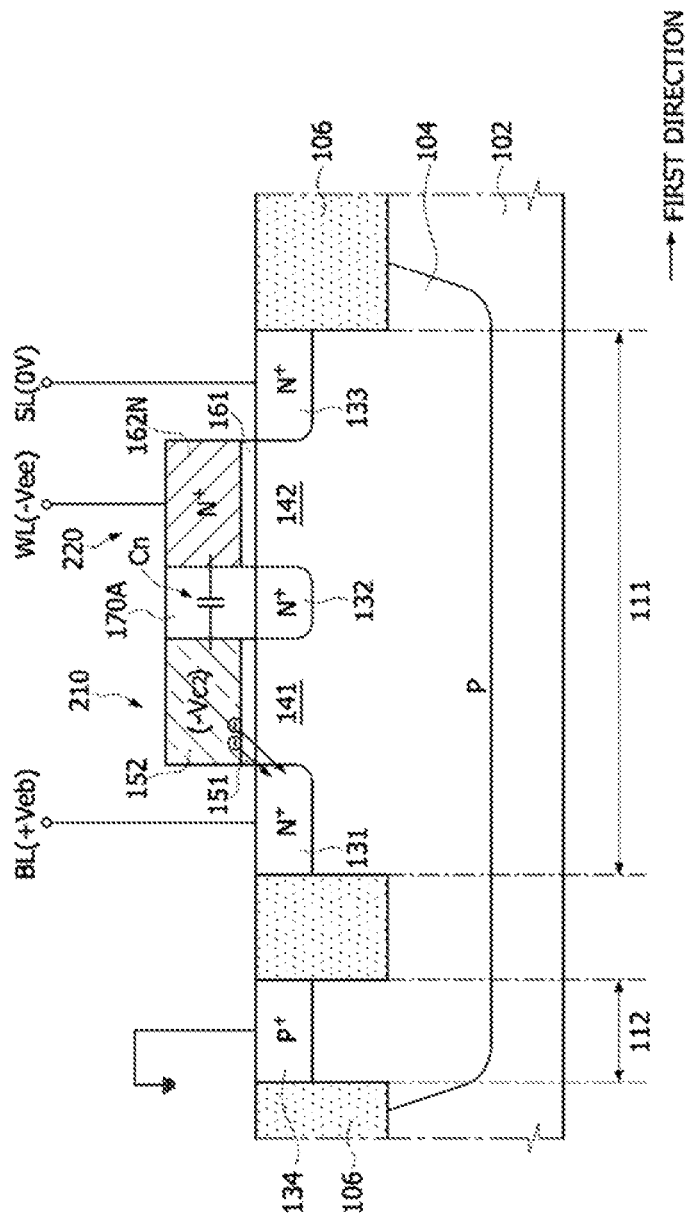
FIG. 8 is a cross-sectional view illustrating an erasure operation of a nonvolatile memory cell, according to an embodiment of the present disclosure.
Figure 9:
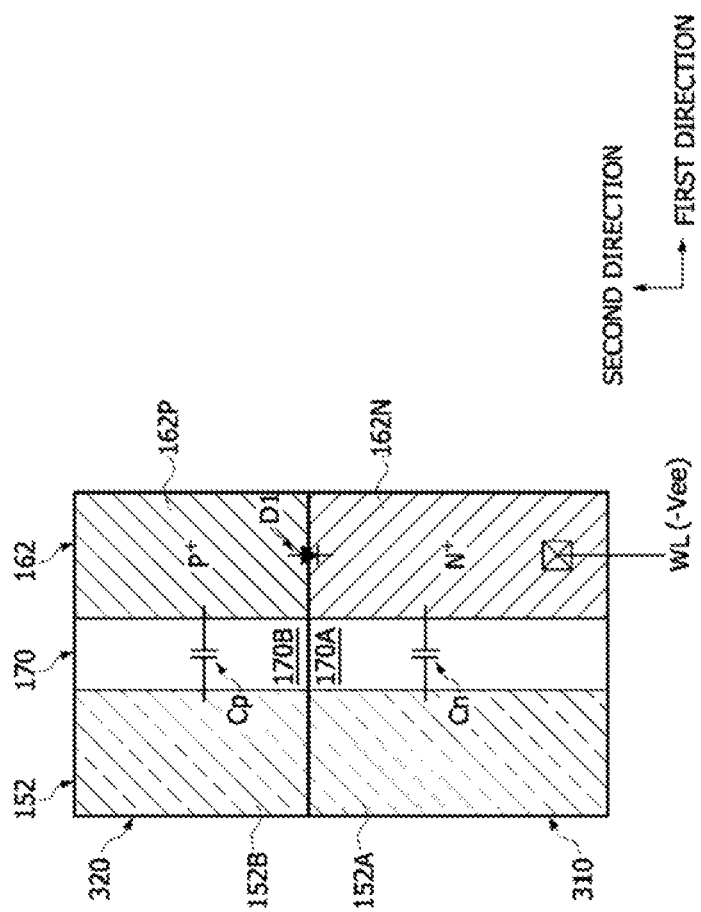
FIG. 9 is a plane view illustrating a coupling mechanism between a selection gate and a floating gate during an erasure operation of a nonvolatile memory cell, according to an embodiment of the present disclosure.

FIG. 8 is a cross-sectional view illustrating an erasure operation of a nonvolatile memory cell, according to an embodiment of the present disclosure. FIG. 9 is a plane view illustrating a coupling mechanism between a selection gate and a floating gate during the erasure operation of the nonvolatile memory cell shown in FIG. 8. In FIG. 8, the same reference numerals or designators as used in FIG. 3 denote the same elements. The erasure operation according to the present embodiment may be achieved by a band-to-band tunneling (BTBT) mechanism. Referring to FIG. 8, to execute the erasure operation of the NVM cell (corresponding to the NVM cell 100 shown in FIGS. 2-5), a negative erasure voltage −Vee may be applied to the word line WL and a positive erasure bit line voltage +Veb may be applied to the bit line BL. In addition, a ground voltage may be applied to the source line SL. In some embodiments, the negative erasure voltage −Vee and the positive erasure bit line voltage +Veb may be approximately −9 volts and approximately +6 volts, respectively. As the negative erasure voltage −Vee is applied to the word line WL, the selection transistor 220 may be turned off. Thus, the second N-type junction region 132 may be electrically floated.

As illustrated in FIG. 9, as the negative erasure voltage −Vee is applied to the N-type selection gate 162N through the word line WL, the P-N diode D1 may be forward-biased to act as a short circuit. Thus, the negative erasure voltage −Vee may be applied to both of the N-type selection gate 162N and the P-type selection gate 162P. Thus, during the erasure operation, a coupling voltage induced at the floating gate 152 may be influenced by the first coupling capacitor Cn (comprised of the first floating gate 152A, the first dielectric layer 170A and the N-type selection gate 162N) as well as the second coupling capacitor Cp (comprised of the second floating gate 152B, the second dielectric layer 170B and the P-type selection gate 162P), as indicated by boxes 310 and 320 of FIG. 9. That is, the coupling voltage induced at the floating gate 152 may be determined by the negative erasure voltage −Vee and a cell coupling ratio relating to the first and second coupling capacitors Cn and Cp.

Referring again to FIG. 8, a negative coupling erasure voltage −Vc2 may be induced at the floating gate 152 under the above bias condition for the erasure operation, and no inversion layer may be formed in the first channel region 141 between the first and second N-type junction regions 131 and 132. Since the positive erasure bit line voltage +Veb is applied to the first N-type junction region 131 through the bit line BL, a depletion region may be formed in a junction region between the first channel region 141 and the first N-type junction region 131. Accordingly, a deep energy band bending phenomenon may occur in the junction region between the first channel region 141 and the first N-type junction region 131 to be greater than an energy band gap of a material of the junction region. As a result, electrons in the floating gate 152 may be injected into the first N-type junction region 131 through the first gate insulation layer 151 by a tunneling mechanism. As the electrons in the floating gate 152 are injected into the first N-type junction region 131, the NVM cell 100 may be erased and a threshold voltage of the erased cell transistor 210 may become less than a threshold voltage of the programmed cell transistor 210.

Figure 10:
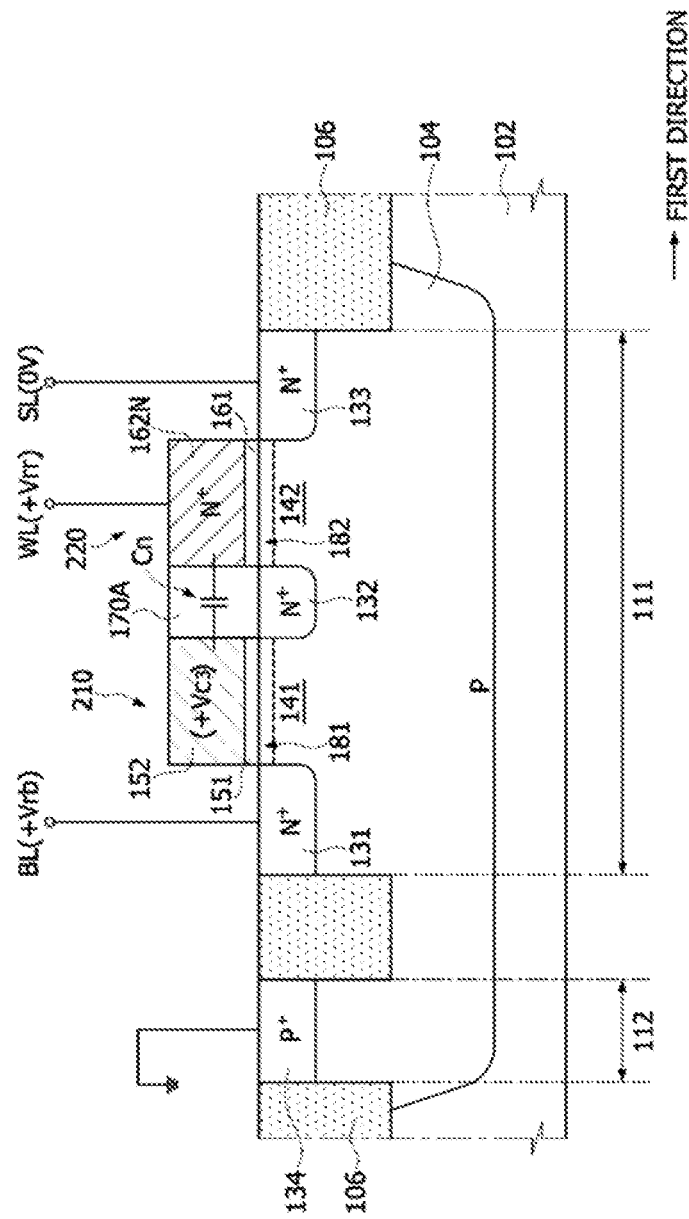
FIG. 10 is a cross-sectional view illustrating a read operation of a nonvolatile memory cell, according to an embodiment of the present disclosure.

FIG. 10 is a cross-sectional view illustrating a read operation of a nonvolatile memory cell, according to an embodiment of the present disclosure. In FIG. 10, the same reference numerals or designators as used in FIG. 3 denote the same elements. Referring to FIG. 10, to execute the read operation of the NVM cell (corresponding to the NVM cell 100 shown in FIGS. 2-5), a positive read voltage +Vrr may be applied to the word line WL and a positive read bit line voltage +Vrb may be applied to the bit line BL. In addition, a ground voltage may be applied to the source line SL. The positive read voltage +Vrr may be less than a threshold voltage of the cell transistor 210 having a programmed status and may be higher than a threshold voltage of the cell transistor 210 having an erased status. In some embodiments, the positive read voltage +Vrr and the positive read bit line voltage +Vrb may be approximately +4 volts and approximately +1 volt, respectively. While the positive read voltage +Vrr is applied to the word line WL, an inversion layer 182 may be formed in the second channel region 142 between the second and third N-type junction regions 132 and 133. Thus, the selection transistor 220 may be turned on, and the ground voltage applied to the source line SL may be transmitted to the second N-type junction region 132 through the inversion layer 182.

As the positive read voltage +Vrr is applied to the N-type selection gate 162N through the word line WL, the positive read voltage +Vrr may be applied only to the N-type selection gate 162N and may not be transmitted to the P-type selection gate 162P, as described with reference to FIG. 7. Thus, during the read operation, a coupling voltage induced at the floating gate 152 may be influenced by the first coupling capacitor Cn (comprised of the first floating gate 152A, the first dielectric layer 170A and the N-type selection gate 162N) without the second coupling capacitor Cp. That is, the coupling voltage induced at the floating gate 152 may be determined by the positive read voltage +Vrr and a cell coupling ratio relating to the first coupling capacitor Cn without the second coupling capacitor Cp. If a positive coupling read voltage +Vc3 is induced at the floating gate 152 under the above bias condition for the read operation, an inversion layer 181 may be formed or not in the first channel region 141 according to a threshold voltage of the cell transistor 210. For example, if the cell transistor 210 has a programmed status, no inversion layer may be formed in the first channel region 141 even though the positive coupling read voltage +Vc3 is induced at the floating gate 152 under the above bias condition for the read operation. Thus, no current may flow through the bit line BL and the source line SL. On the contrary, if the cell transistor 210 has an erased status, an inversion layer 181 may be formed in the first channel region 141 since the positive coupling read voltage +Vc3 is induced at the floating gate 152 under the above bias condition for the read operation. Thus, a certain current may flow through the bit line BL and the source line SL. Accordingly, the status that is, information, of the NVM cell 100 may be read out by sensing a current flowing through the bit line BL.

Figure 11:
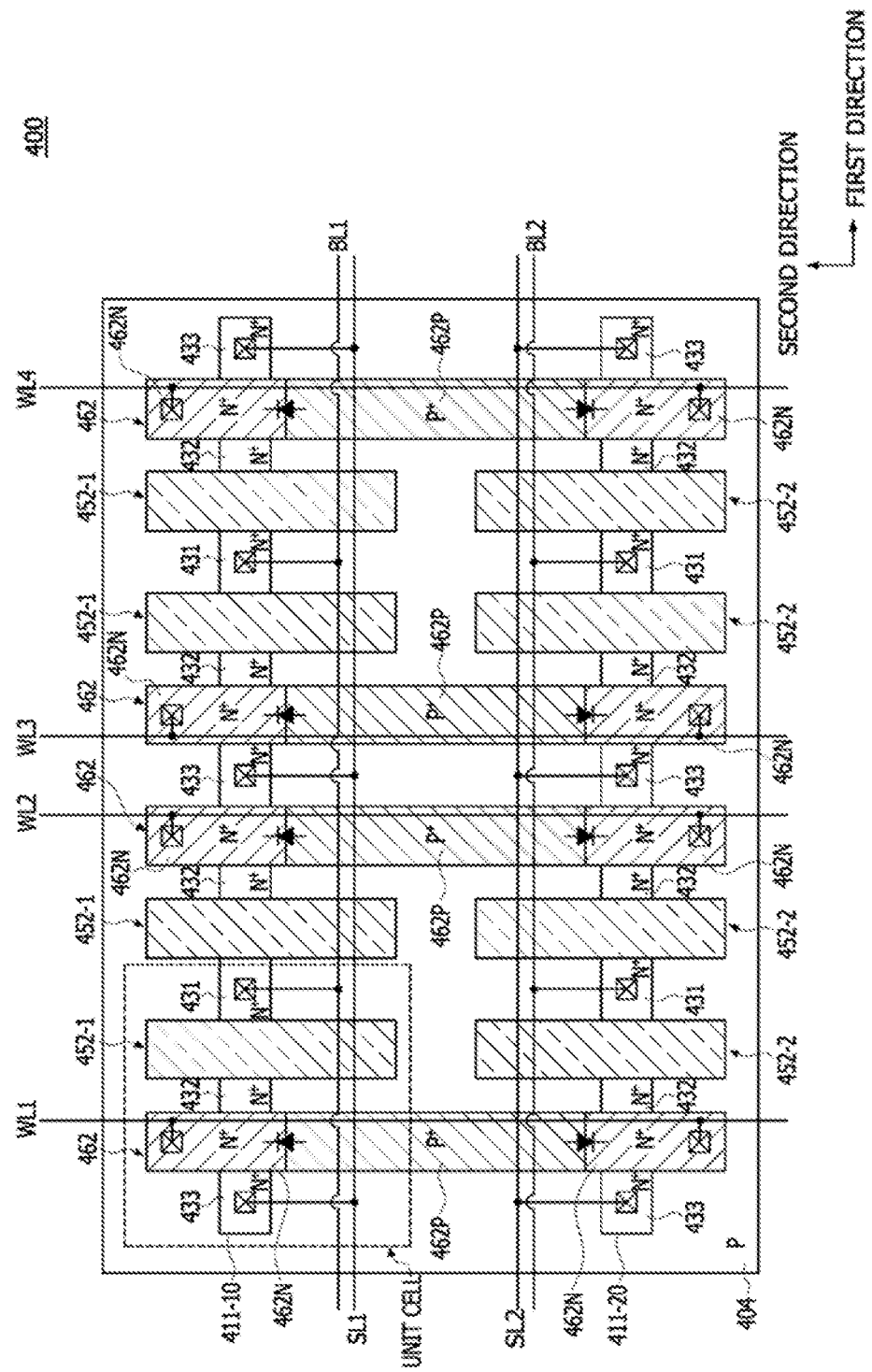
FIG. 11 is a layout diagram illustrating a nonvolatile memory cell array according to an embodiment of the present disclosure.

FIG. 11 is a layout diagram illustrating an NVM cell array 400 according to an embodiment of the present disclosure. The NVM cell array 400 may include a plurality of unit cells which are located at cross points of two rows and four columns to have a '2×4' matrix form. However, the NVM cell array 400 shown in FIG. 11 is merely an example of suitable NVM cell arrays. Thus, in some embodiments, the NVM cell array 400 may include a plurality of unit cells which are located at cross points of three or more rows and five or more columns. Referring to FIG. 11, a first active region 411-10 and a second active region 411-20 may be disposed in a P-type well region 404. All of the unit cells of the NVM cell array 400 may share the P-type well region 404 with each other. The P-type well region 404 may be grounded during a program operation, an erasure operation and a read operation of the NVM cell array 400. Each of the first and second active regions 411-10 and 411-20 may have a stripe shape extending in a first direction. The first and second active regions 411-10 and 411-20 may be spaced apart from each other in a second direction intersecting the first direction. The first and second directions may be perpendicular to one another as illustrated in the embodiment of FIG. 11. However, the present disclosure is not limited in this way.

Although not shown in FIG. 11, the first and second active regions 411-10 and 411-20 may be defined by a trench isolation layer. The unit cells arrayed in a first row may share the first active region 411-10 with each other, and the unit cells arrayed in a second row may share the second active region 411-20 with each other.

A plurality of selection gates 462 may be spaced apart from each other in the first direction. Each of the selection gates 462 may have a stripe shape extending in the second direction in a plane view. Thus, each of the selection gates 462 may intersect the first and second active regions 411-10 and 411-20. Each of the selection gates 462 may be coupled to the unit cells arrayed in any one of the columns. Each of the selection gates 462 may be configured to include a pair of N-type selection gates 462N and a P-type selection gate 462P disposed between the pair of N-type selection gates 462N all aligned in the second direction. In each selection gate 462, one of the pair of N-type selection gates 462N may overlap with the first active region 411-10 and the other of the pair of N-type selection gates 462N may overlap with the second active region 411-20. The N-type selection gates 462N overlapping with the first active region 411-10 may be coupled to the unit cells arrayed in the first row, respectively. Similarly, the N-type selection gates 462N overlapping with the second active region 411-20 may be coupled to the unit cells arrayed in the second row, respectively. In each selection gate 462, since the P-type selection gate 462P is disposed between the pair of N-type selection gates 462N, the P-type selection gate 462P may not overlap with any of the first and second active regions 411-10 and 411-20. In each column, the P-type selection gate 462P may be coupled to both of the unit cell arrayed in the first row and the unit cell arrayed in the second row. In each selection gate 462, the P-type selection gate 462P and one of the N-type selection gates 462N may constitute a P-N diode. The N-type selection gates 462N disposed in each column may be coupled to any one of word lines WL1~WL4.

A plurality of first floating gates 452-1 may be arrayed in the first row spaced apart from each other in the first direction, and a plurality of second floating gates 452-2 may be arrayed in the second row spaced apart from each other in the first direction. The first floating gate 452-1 and the second floating gate 452-2 disposed in each column may be spaced apart from each other in the second direction at a regular interval. The first floating gates 452-1 may intersect the first active region 411-10 to be parallel with the selection gates 462. Although not shown in FIG. 11, in each of the unit cells arrayed in the first row, a dielectric layer may be disposed between the first floating gate 452-1 and the selection gate 462 adjacent to each other. Thus, the first floating gate 452-1, the selection gate 462, and the dielectric layer therebetween may constitute a coupling capacitor. The second floating gates 452-2 may intersect the second active region 411-20 to be parallel with the selection gates 462. Although not shown in FIG. 11, in each of the unit cells arrayed in the second row, a dielectric layer may also be disposed between the second floating gate 452-2 and the selection gate 462 adjacent to each other. Thus, the second floating gate 452-2, the selection gate 462, and the dielectric layer therebetween may constitute a coupling capacitor.

Each of the unit cells UNIT CELL may include a first N-type junction region 431, a second N-type junction region 432 and a third N-type junction region 433 which are disposed in the first active region 411-10 or the second active region 411-20. The second N-type junction region 432 may be disposed in the first active region 411-10 or the second active region 411-20 between the selection gate 462 and the first floating gate 452-1 or the second floating gate 452-2. The first N-type junction region 431 may be disposed in the first active region 411-10 or the second active region 411-20 adjacent to a sidewall of the first floating gate 452-1 or the second floating gate 452-2 opposite to the second N-type junction region 432, and the third N-type junction region 433 may be disposed in the first active region 411-10 or the second active region 411-20 adjacent to a sidewall of the selection gate 462 opposite to the second N-type junction region 432. The first N-type junction region 431 and the third N-type junction region 433 in the first active region 411-10 may be coupled to a first bit line BL1 and a first source line SL1, respectively. The first N-type junction region 431 and the third N-type junction region 433 in the second active region 411-20 may be coupled to a second bit line BL2 and a second source line SL2, respectively.

Figure 12:
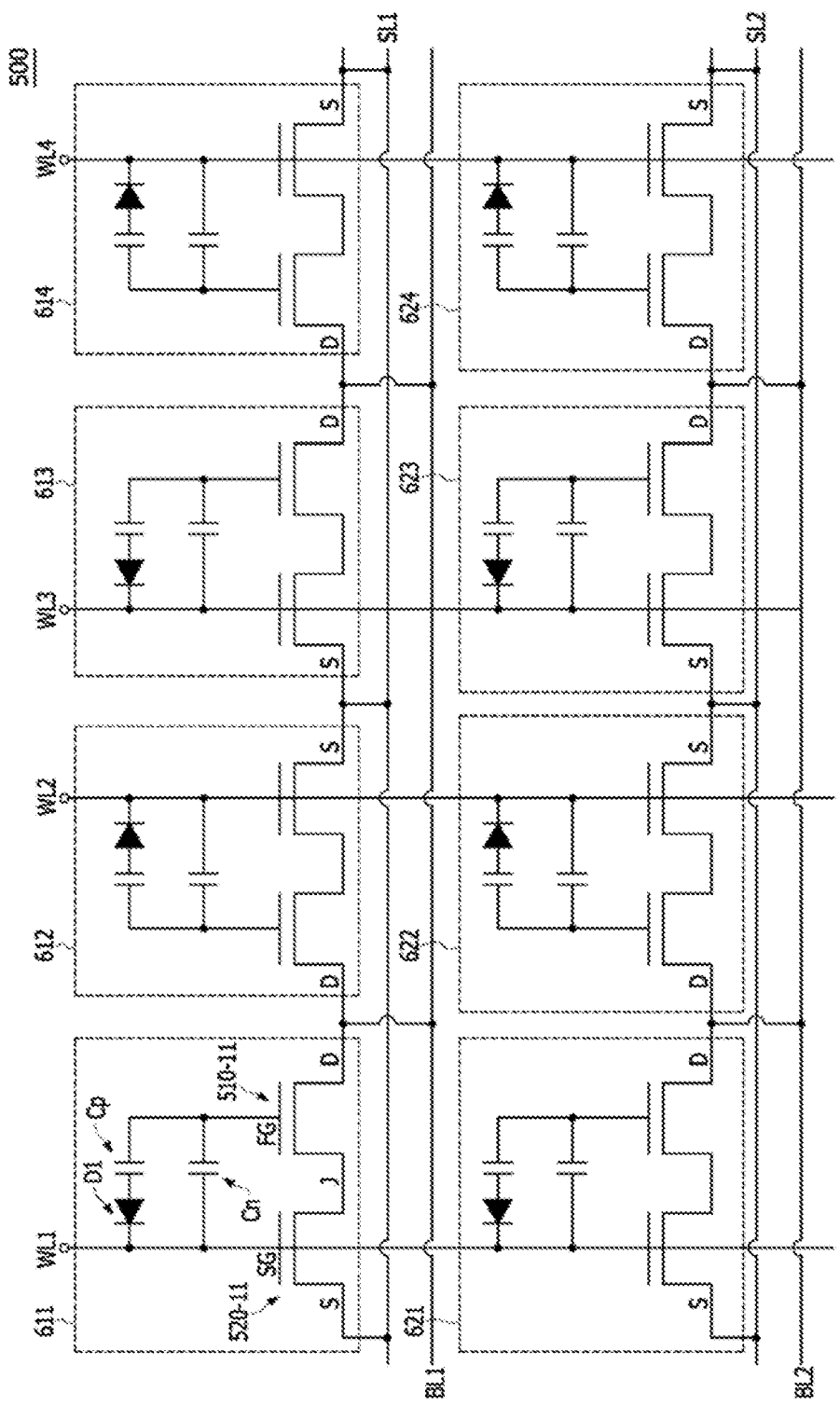
FIG. 12 is an equivalent circuit diagram illustrating a nonvolatile memory cell array according to an embodiment of the present disclosure.

FIG. 12 is an equivalent circuit diagram 500 illustrating an NVM cell array, according to an embodiment of the present disclosure. Referring to FIG. 12, the equivalent circuit diagram 500 may include a plurality of unit cells 611~614 and 621~624 which are located at cross points of two rows and four columns in a '2×4' matrix form. However, the equivalent circuit diagram 500 shown in FIG. 12 is merely an example of suitable equivalent circuit diagrams for various NVM cell arrays. Thus, in some embodiments, the equivalent circuit diagram 500 may include a plurality of unit cells which are located at cross points of three or more rows and five or more columns. The rows may be distinguished by bit lines BL1 and BL2 or source lines SL1 and SL2, and the columns may be distinguished by word lines WL1~WL4. The plurality of unit cells 611~614 and 621~624 may have the same configuration. For example, the unit cell 611 located at a cross point of the first row and the first column may include a cell transistor 510-11 and a selection transistor 520-11. Each of the cell and the selection transistors 510-11 and 520-11 may be realized using an N-channel MOS transistor. The cell transistor 510-11 may have a floating gate FG, a junction terminal J and a drain terminal D. The selection transistor 520-11 may have a selection gate terminal SG, the junction terminal J and a source terminal S. The source terminal S of the selection transistor 520-11 (also referred to as the source terminal S of the unit cell 611) and the drain terminal D of the cell transistor 510-11 (also referred to as the drain terminal D of the unit cell 611) may be coupled to the first source line SL1 and the first bit line BL1, respectively. The junction terminal J may be electrically isolated to have a floating status. The selection gate terminal SG may be coupled to the first word line WL1. A first coupling capacitor Cn and a second coupling capacitor Cp may be coupled in parallel between the floating gate FG and the selection gate terminal SG. A P-N diode D1 may be coupled between the selection gate terminal SG and the second coupling capacitor Cp. An anode and a cathode of the P-N diode D1 may be coupled to the second coupling capacitor Cp and the selection gate terminal SG, respectively.

The respective source terminals S of the unit cells 611~614 arrayed in the first row may be coupled to the first source line SL1 in common. The respective drain terminals D of the unit cells 611~614 arrayed in the first row may be coupled to the first bit line BL1 in common. The respective source terminals S of the unit cells 621~624 arrayed in the second row may be coupled to the second source line SL2 in common. The respective drain terminals D of the unit cells 621~624 arrayed in the second row may be coupled to the second bit line BL2 in common. The respective selection gate terminals SG of the unit cells 611 and 621 arrayed in the first column may be coupled to the first word line WL1 in common. The respective selection gate terminals SG of the unit cells 612 and 622 arrayed in the second column may be coupled to the second word line WL2 in common. The respective selection gate terminals SG of the unit cells 613 and 623 arrayed in the third column may be coupled to the third word line WL3 in common and the respective selection gate terminals SG of the unit cells 614 and 624 arrayed in the fourth column may be coupled to the fourth word line WL4 in common.

Figure 13:
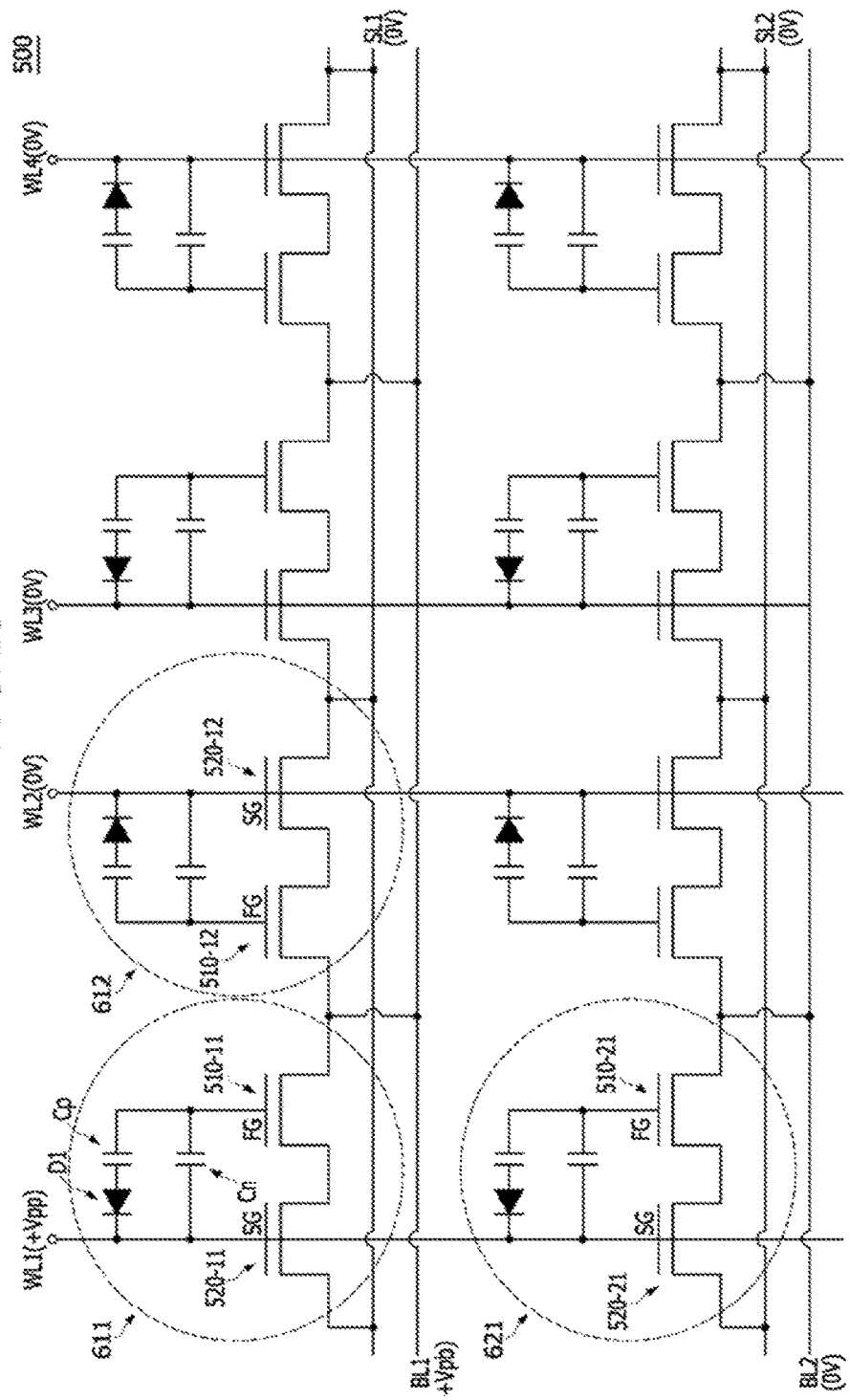
FIG. 13 is an equivalent circuit diagram illustrating a program operation of a selected unit cell in a nonvolatile memory cell array according to an embodiment of the present disclosure.

FIG. 13 is an equivalent circuit diagram illustrating a program operation of a selected unit cell 611 among the plurality of unit cells 611-624 in an NVM cell array 500, according to an embodiment of the present disclosure. In FIG. 13, the same reference numerals or designators as used in FIG. 12 denote the same elements. Referring to FIG. 13, to selectively program the unit cell 611 located at a cross point of the first row and the first column, a positive program voltage +Vpp may be applied to the first word line WL1 connected to the selected unit cell 611 and the remaining word lines WL2, WL3 and WL4 may be grounded. In addition, a positive program bit line voltage +Vpb and a ground voltage may be applied to the first bit line BL1 and the first source line SL1 connected to the selected unit cell 611, respectively. The remaining bit line BL2 and the remaining source line SL2 may be grounded. The positive program voltage +Vpp applied to the first word line WL1 may be transmitted to the selection gate terminal SG of the selection transistor 520-11 to turn on the selection transistor 520-11. If the positive program voltage +Vpp is transmitted to the selection gate terminal SG, a positive coupling voltage may be induced at the floating gate FG of the cell transistor 510-11 due to the presence of the first coupling capacitor Cn between the first word line WL1 and the floating gate FG. In such a case, the P-N diode D1 of the selected unit cell 611 may be reverse-biased to provide an open circuit. Under the above bias condition, the cell transistor 510-11 may be programmed by a hot electron injection (HEI) mechanism.

Regarding the non-selected unit cells for example, the unit cell 612 located at a cross point of the first row and the second column, sharing the first bit line BL1 and the first source line SL1 with the selected unit cell 611, the second word line WL2 may be grounded to turn off the selection transistor 520-12 and a coupling voltage corresponding to approximately the ground voltage may be induced at the floating gate FG of the cell transistor 510-12. This is due to a P-type well region corresponding to a bulk region of all of the cell transistors being grounded, as described with reference to FIG. 11. Thus, programming of the unit cell 612 is prohibited. Regarding the non-selected unit cells for example, the unit cell 621 located at a cross point of the second row and the first column, sharing the first word line WL1 with the selected unit cell 611, a positive coupling voltage may be induced at the floating gate FG of the cell transistor 510-21 since the positive program voltage +Vpp is applied to the first word line WL1. Thus, both of the cell transistor 510-21 and the selection transistor 520-21 may be turned on. However, no hot electrons may be generated in the cell transistor 510-21 since there is no electric potential difference between the second bit line BL2 and the second source line SL2. Accordingly, programming of the unit cell 621 is prohibited.

Figure 14:
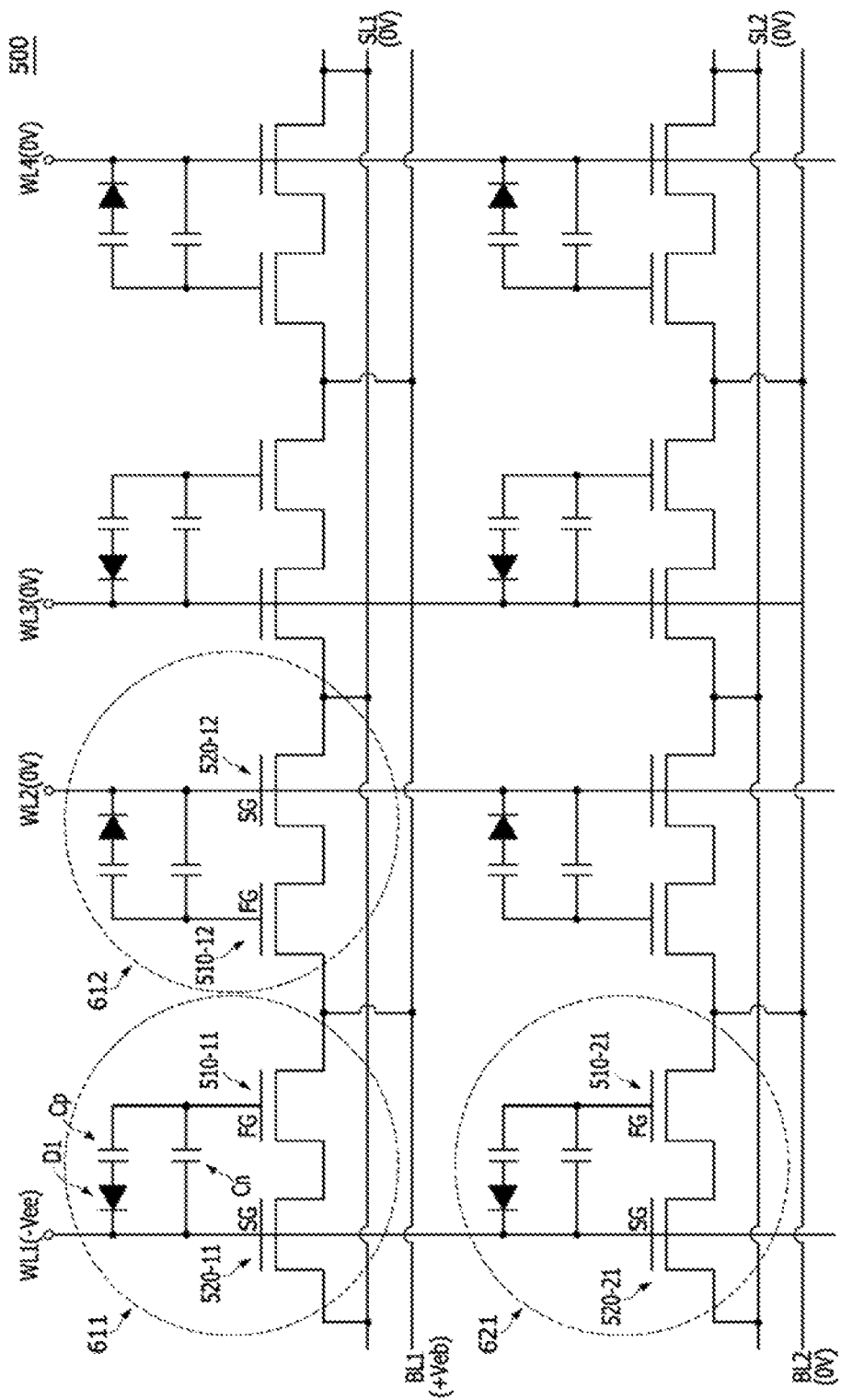
FIG. 14 is an equivalent circuit diagram illustrating an erasure operation of a selected unit cell in a nonvolatile memory cell array according to an embodiment of the present disclosure.

FIG. 14 is an equivalent circuit diagram illustrating an erasure operation of a selected unit cell 611 in an NVM cell array 500, according to an embodiment of the present disclosure. In FIG. 14, the same reference numerals or designators as used in FIG. 12 denote the same elements. Referring to FIG. 14, to selectively erase the unit cell 611 located at a cross point of the first row and the first column, a negative erasure voltage −Vee may be applied to the first word line WL1 connected to the selected unit cell 611. The remaining word lines WL2, WL3 and WL4 may be grounded. In addition, a positive erasure bit line voltage +Veb and a ground voltage may be applied to the first bit line BL1 and the first source line SL1 connected to the selected unit cell 611, respectively. The remaining bit line BL2 and the remaining source line SL2 may be grounded. By applying the negative erasure voltage −Vee to the selection gate terminal SG of the selection transistor 520-11 through the first word line WL1, the P-N diode D1 of the selected unit cell 611 may be forward-biased to provide a short circuit. Thus, the floating gate FG of the cell transistor 510-11 may be coupled to the first word line WL1 through both of the first and second coupling capacitors Cn and Cp, and a negative coupling voltage may be induced at the floating gate FG of the cell transistor 510-11. In such a case, the cell transistor 510-11 may be erased by a band-to-band tunneling (BTBT) mechanism which is due to a voltage difference between the negative coupling voltage induced at the floating gate FG and the positive erasure bit line voltage +Veb applied to the first bit line BL1.

Regarding the non-selected unit cells for example, the unit cell 612 located at a cross point of the first row and the second column, sharing the first bit line BL1 and the first source line SL1 with the selected unit cell 611, the second word line WL2 may be grounded to turn off the selection transistor 520-12 and a coupling voltage corresponding to approximately the ground voltage may be induced at the floating gate FG of the cell transistor 510-12. This is due to a P-type well region corresponding to a bulk region of all of the cell transistors being grounded, as described with reference to FIG. 11. Thus, a voltage difference between the floating gate FG of the cell transistor 510-12 and the first bit line BL1 may correspond to only the positive erasure bit line voltage +Veb. This voltage difference corresponding to the positive erasure bit line voltage +Veb is too small to cause the BTBT phenomenon in the cell transistor 510-12. Accordingly, the erasure of the unit cell 612 is prohibited. Regarding the non-selected unit cells for example, the unit cell 621 located at a cross point of the second row and the first column, sharing the first word line WL1 with the selected unit cell 611, a negative coupling voltage may be induced at the floating gate FG of the cell transistor 510-21 since the negative erasure voltage −Vee is applied to the first word line WL1. However, since the second bit line BL2 is grounded, a voltage difference between the floating gate FG of the cell transistor 510-21 and the second bit line BL2 may correspond to only the negative erasure voltage −Vee. This voltage difference corresponding to the negative erasure voltage −Vee is too small to cause the BTBT phenomenon in the cell transistor 510-21. Accordingly, the erasure of the unit cell 621 is prohibited.

Although FIG. 14 illustrates an example in which any one for example, the unit cell 611 located at a cross point of the first row and the first column, among the plurality of unit cells is selectively erased, all of the plurality of unit cells may be erased in bulk if necessary. To execute the bulk erasure operation, the negative erasure voltage −Vee may be applied to all of the word lines WL1~WL4 and the positive erasure bit line voltage +Veb may be applied to all of the bit lines BL1 and BL2. In addition, all of the source lines SL1 and SL2 may be grounded. Under the above bias condition, all of the cell transistors of the plurality of unit cells may be erased by a BTBT mechanism in bulk.

Figure 15:
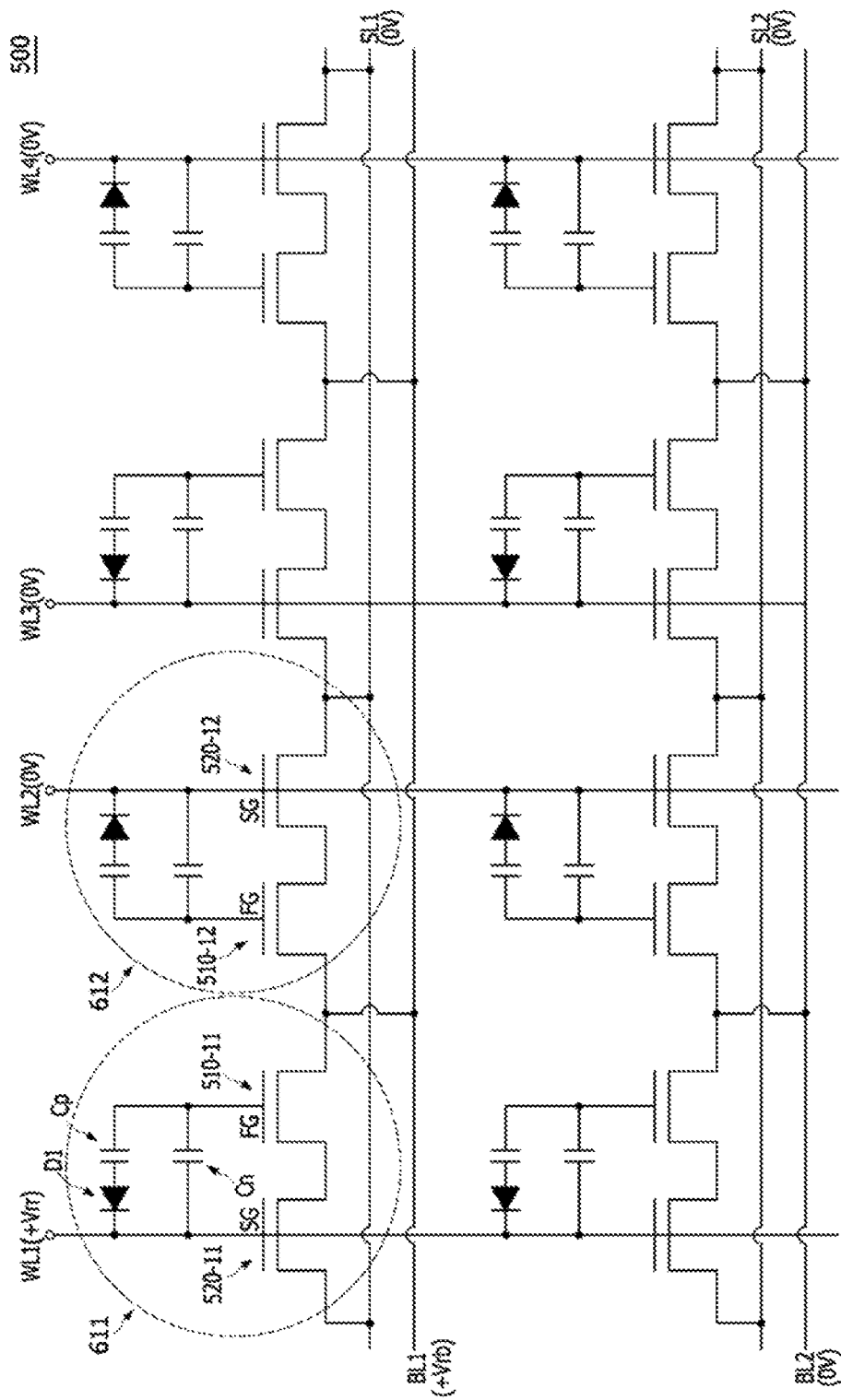
FIG. 15 is an equivalent circuit diagram illustrating a read operation of a selected unit cell in a nonvolatile memory cell array according to an embodiment of the present disclosure.

FIG. 15 is an equivalent circuit diagram illustrating a read operation of a selected unit cell in an NVM cell array according to an embodiment of the present disclosure. In FIG. 15, the same reference numerals or designators as used in FIG. 12 denote the same elements. Referring to FIG. 15, to selectively read out information stored in the unit cell 611 located at a cross point of the first row and the first column, a positive read voltage +Vrr may be applied to the first word line WL1 connected to the selected unit cell 611 and the remaining word lines WL2, WL3 and WL4 may be grounded. In addition, a positive read bit line voltage +Vrb and a ground voltage may be applied to the first bit line BL1 and the first source line SL1 connected to the selected unit cell 611, respectively. The remaining bit line BL2 and the remaining source line SL2 may be grounded.

As the positive read voltage +Vrr is applied to the first word line WL1, the selection transistor 520-11 may be turned on and a positive coupling voltage may be induced at the floating gate FG of the cell transistor 510-11 by a coupling operation of the first coupling capacitor Cn between the first word line WL1 and the floating gate FG. In such a case, the P-N diode D1 of the selected unit cell 611 may be reverse-biased to provide an open circuit. Thus, the second coupling capacitor Cp of the selected unit cell 611 does not affect the coupling operation between the first word line WL1 and the floating gate FG. As the positive coupling voltage is induced at the floating gate FG of the cell transistor 510-11, the cell transistor 510-11 may be turned on or turned off according to a threshold voltage of the cell transistor 510-11. For example, if the cell transistor 510-11 has a programmed status, the cell transistor 510-11 may be turned off under the above read bias condition. In contrast, if the cell transistor 510-11 has an erased status, the cell transistor 510-11 may be turned on under the above read bias condition. If the cell transistor 510-11 is turned off, no current flows through the first bit line BL1 and the first source line SL1. However, if the cell transistor 510-11 is turned on, a current may flow through the first bit line BL1 and the first source line SL1 due to an electric potential difference between the first bit line BL1 and the first source line SL1. Accordingly, the information of the cell transistor 510-11 may be read out by sensing the current flowing through the first bit line BL1 and the first source line SL1.

Regarding the non-selected unit cells for example, the unit cell 612 located at a cross point of the first row and the second column, sharing the first bit line BL1 and the first source line SL1 with the selected unit cell 611, both of the cell transistor 510-12 and the selection transistor 520-12 of the unit cell 612 may be turned off since the second word line WL2 is grounded. Thus, no current flows through the unit cell 612, and the unit cell 612 does not affect the read operation of the selected unit cell 611.

Figure 16:
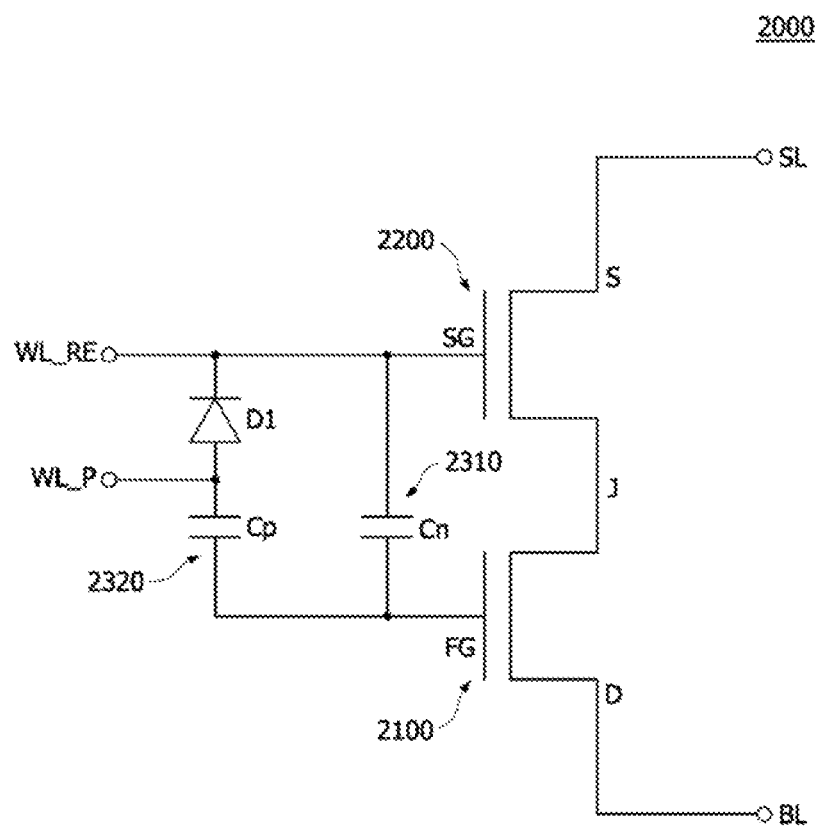
FIG. 16 is an equivalent circuit diagram illustrating a nonvolatile memory cell, according to another embodiment of the present disclosure.

FIG. 16 is an equivalent circuit diagram of an NVM cell 2000, according to another embodiment of the present disclosure. Referring to FIG. 16, the NVM cell 2000 may be configured to include a cell transistor 2100 and a selection transistor 2200. In some embodiments, each of the cell transistor 2100 and the selection transistor 2200 may be realized to have a structure of an N-channel MOS transistor. The cell transistor 2100 may have a floating gate FG and a drain terminal D coupled to a bit line BL. The selection transistor 2200 may have a selection gate terminal SG coupled to both of a read/erasure word line WL_RE and a program word line WL_P as well as a source terminal S coupled to a source line SL. While the read/erasure word line WL_RE may be directly coupled to the selection gate terminal SG, the program word line WL_P may be coupled to the selection gate terminal SG through a P-N diode D1. The cell transistor 2100 and the selection transistor 2200 may share a junction terminal J with each other, and the junction terminal J may correspond to a source terminal of the cell transistor 2100 as well as a drain terminal of the selection transistor 2200. A first coupling capacitor Cn may exist between the selection gate terminal SG and the floating gate FG. Both electrodes of the first coupling capacitor Cn may be connected to the selection gate terminal SG and the floating gate FG through a first connection line 2310, respectively. A P-N diode D1 and a second coupling capacitor Cp may be coupled in series between the selection gate terminal SG and the floating gate FG. The P-N diode D1 and a second coupling capacitor Cp may be connected to the selection gate terminal SG and the floating gate FG through a second connection line 2320, respectively. The first and second connection lines 2310 and 2320 may be coupled in parallel between the selection gate terminal SG and the floating gate FG. Thus, the first and second coupling capacitors Cn and Cp may also be coupled in parallel between the selection gate terminal SG and the floating gate FG. A capacitance value of the first coupling capacitor Cn may be different from a capacitance value of the second coupling capacitor Cp. The first coupling capacitor Cn may have a capacitance which is greater than a capacitance of the second coupling capacitor Cp. An anode of the P-N diode D1 may be connected to the second coupling capacitor Cp and the program word line WL_P, and a cathode of the P-N diode D1 may be connected to the read/erasure word line WL_RE.

If a positive bias having a certain voltage is applied to the read/erasure word line WL_RE, the P-N diode D1 may be reverse-biased to provide the second connection line 2320 having an open circuit. Thus, a coupling bias having a certain voltage may be induced at the floating gate FG by the first coupling capacitor Cn. In such a case, a coupling voltage induced at the floating gate FG may be influenced by a first coupling ratio that relates to the first coupling capacitor Cn and excludes the second coupling capacitor Cp. In contrast, if a positive bias having a certain voltage is applied to the program word line WL_P or a negative bias having a certain voltage is applied to the read/erasure word line WL_RE, a forward bias may be applied to the P-N diode D1 to provide a short circuit between the second coupling capacitor Cp and the read/erasure word line WL_RE. Thus, a coupling bias having a certain voltage may be induced at the floating gate FG by both of the first and second coupling capacitors Cn and Cp. In such a case, a coupling voltage induced at the floating gate FG may be influenced by a second coupling ratio relating to the second coupling capacitor Cp in addition to the first coupling ratio relating to the first coupling capacitor Cn.

As described above, according to the present embodiment illustrated in FIG. 16, a cell coupling ratio for calculating a coupling bias voltage induced at the floating gate FG during the program operation or the erasure operation may be different from a cell coupling ratio for calculating a coupling bias voltage induced at the floating gate FG during the read operation. Since both of the cell transistor 2100 and the selection transistor 2200 are realized using N-channel MOS transistors, the program operation may be performed by applying a positive bias voltage to the program word line WL_P and the read operation may be performed by applying a positive bias voltage to the read/erasure word line WL_RE. In contrast, the erasure operation may be performed by applying a negative bias voltage to the read/erasure word line WL_RE. Accordingly, a cell coupling ratio used in calculation of a coupling bias voltage induced at the floating gate FG during the program operation or the erasure operation may be different from a cell coupling ratio used in calculation of a coupling bias voltage induced at the floating gate FG during the read operation. In particular, during the program operation or the erasure operation, both of the first and second coupling capacitors Cn and Cp directly influence a coupling operation between the floating gate FG and the selection gate terminal SG to maximize a cell coupling ratio of the NVM cell shown in FIG. 16. In contrast, during the read operation, only the first coupling capacitor Cn of the first and second coupling capacitors Cn and Cp influences a coupling operation between the floating gate FG and the selection gate terminal SG to reduce a cell coupling ratio of the NVM cell shown in FIG. 16. A configuration and various operations of the NVM cell, according to the present embodiment will be described more fully hereinafter.

Figure 17:
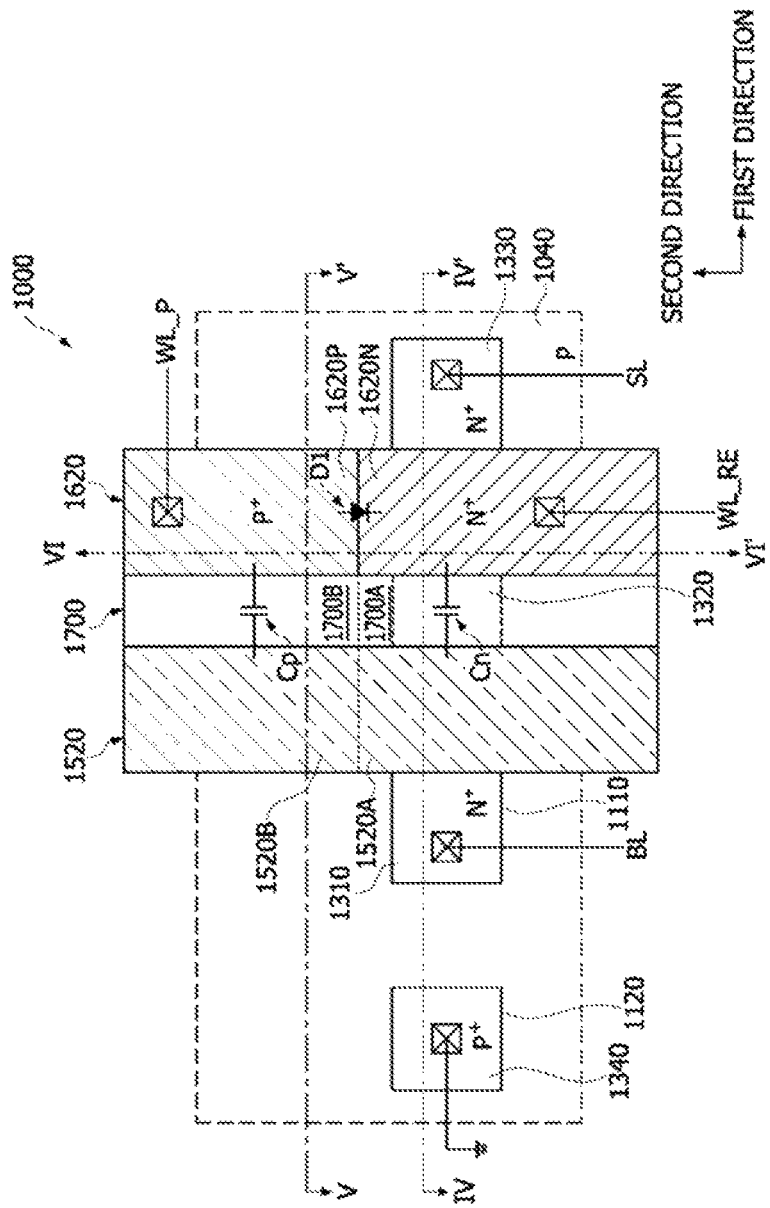
FIG. 17 is a layout diagram illustrating a nonvolatile memory cell, according to another embodiment of the present disclosure.
Figure 18:
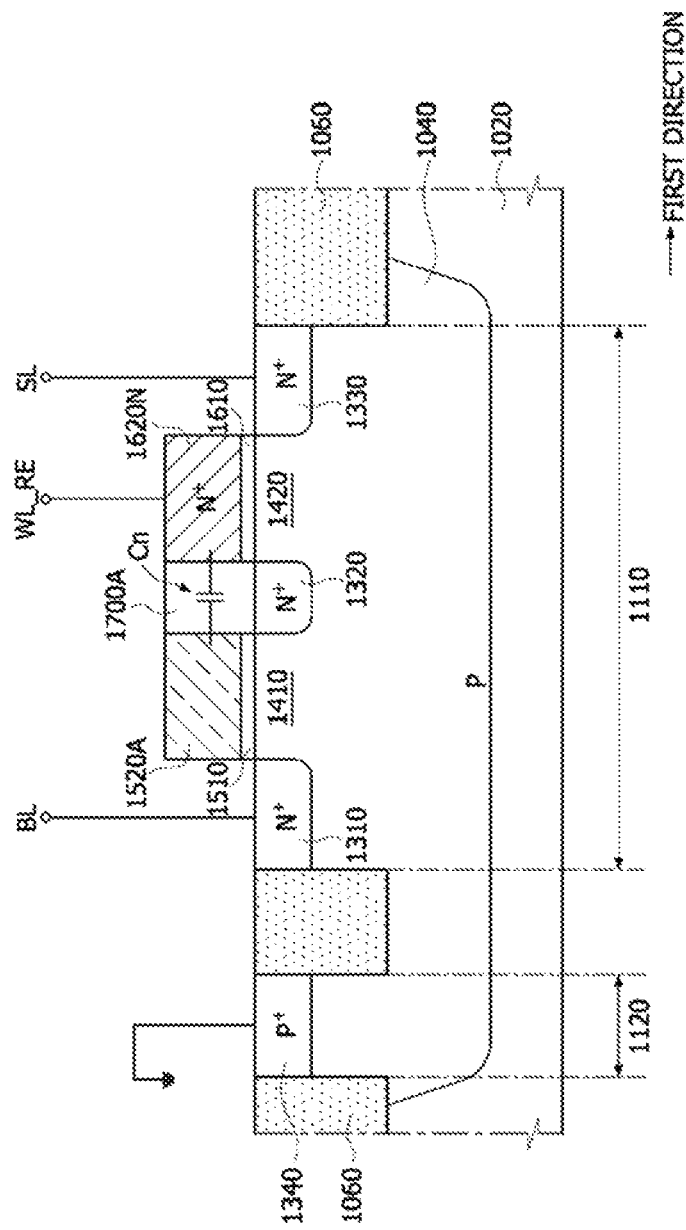
FIG. 18 is a cross-sectional view taken along a line IV-IV' of FIG. 17.
Figure 19:
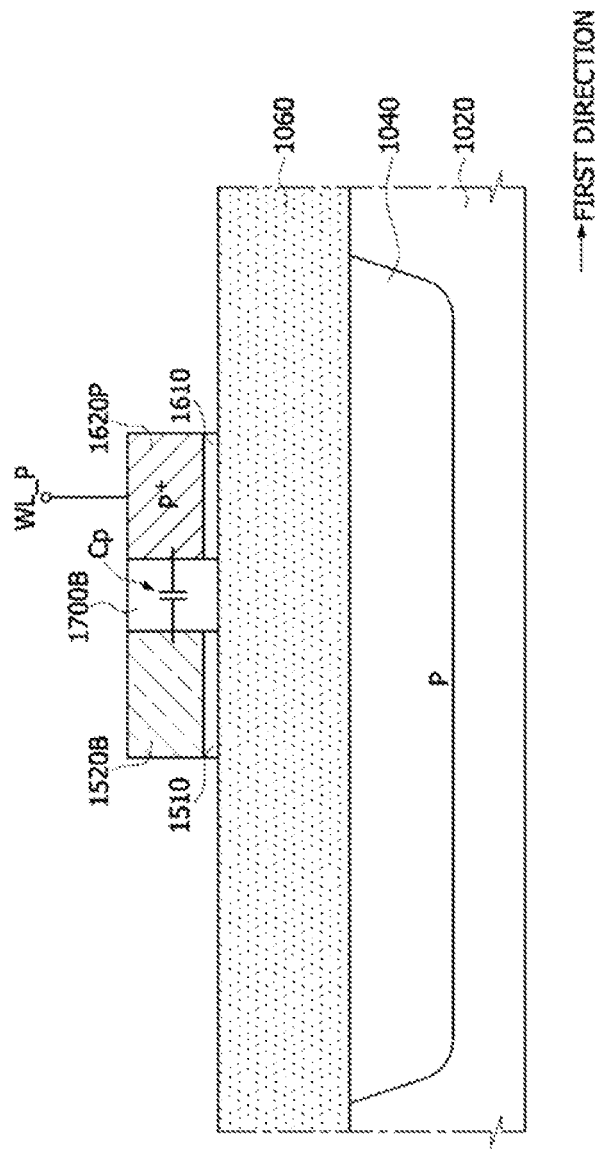
FIG. 19 is a cross-sectional view taken along a line V-V' of FIG. 17.
Figure 20:
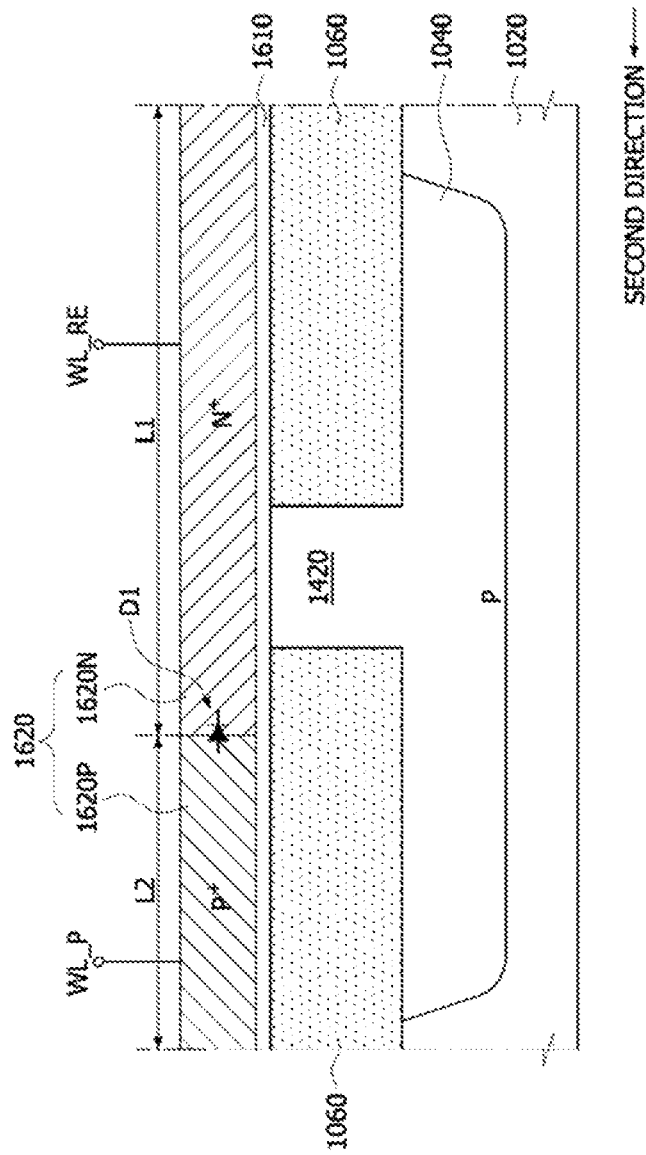
FIG. 20 is a cross-sectional view taken along a line VI-VI' of FIG. 17.

FIG. 17 is a layout diagram illustrating an NVM cell 1000, according to another embodiment of the present disclosure. FIGS. 18, 19 and 20 are cross-sectional views taken along lines IV-IV', V-V' and VI-VI' of FIG. 17, respectively. Referring to FIGS. 17 to 20, a P-type semiconductor region, for example, a P-type well region 1040 may be disposed in an upper portion of a substrate 1020. A trench isolation layer 1060 may be disposed in an upper portion of the substrate 1020 to define a first active region 1110 and a second active region 1120. The first and second active regions 1110 and 1120 may be disposed in the P-type well region 1040. The first active region 1110 may have a stripe shape extending in a first direction in a plane view. The second active region 1120 may have a box shape in a plane view. The second active region 1120 may be spaced apart from the first active region 1110 in the first direction.

First, second and third N-type junction regions 1310, 1320 and 1330 may be disposed in the first active region 1110 spaced apart from each other in the first direction. In some embodiments, the first N-type junction region 1310 and the third N-type junction region 1330 may correspond to a drain region and a source region, respectively. The first N-type junction region 1310 and the third N-type junction region 1330 may be disposed in both ends of the first active region 1110, respectively. The second N-type junction region 1320 may be disposed between the first and third N-type junction regions 1310 and 1330. The second N-type junction region 1320 may be spaced apart from the first N-type junction region 1310 by a first channel region 1410 in the first direction. The second N-type Junction region 1320 may be spaced apart from the third N-type junction region 1330 by a second channel region 1420 in the first direction. A P-type contact region 1340 may be disposed in the second active region 1120. The first N-type junction region 1310 and the third N-type junction region 1330 may be coupled to a bit line BL and a source line SL, respectively. The P-type contact region 1340 may be grounded.

A floating gate 1520 and a selection gate 1620 may intersect the first active region 1110. Each of the floating gate 1520 and the selection gate 1620 may have a stripe shape extending in a second direction intersecting the first direction in a plane view. The first and second directions may be perpendicular to one another. The floating gate 1520 and the selection gate 1620 may be spaced apart from each other in the first direction. The floating gate 1520 may overlap with the first channel region 1410 of the first active region 1110. The selection gate 1620 may overlap with the second channel region 1420 of the first active region 1110. A first gate insulation layer 1510 may be disposed between the floating gate 1520 and the first channel region 1410. A second gate insulation layer 1610 may be disposed between the selection gate 1620 and the second channel region 1420. The floating gate 1520 may be electrically isolated from other elements. That is, the floating gate 1520 is not directly connected to other elements. In contrast, the selection gate 1620 may be coupled to both of a program word line WL_P and a read/erasure word line WL_RE. The floating gate 1520 and the selection gate 1620 may have a single polysilicon structure that is, a single-layered polysilicon gate structure which is comprised of a single polysilicon layer. That is, the floating gate 1520 and the selection gate 1620 may be comprised of the same polysilicon layer. A distance between the floating gate 1520 and the selection gate 1620 may be substantially uniform along the second direction. A dielectric layer 1700 may be disposed between the floating gate 1520 and the selection gate 1620.

The selection gate 1620 may include an N-type selection gate 1620N and a P-type selection gate 1620P which are arrayed in the second direction. A boundary between the N-type selection gate 1620N and the P-type selection gate 1620P may be located on the trench isolation layer 1060 spaced apart from the first active region 1110 by a certain distance. The N-type selection gate 1620N may extend from the boundary between the N-type selection gate 1620N and the P-type selection gate 1620P onto the second channel region 1420. The P-type selection gate 1620P may extend from the boundary between the N-type selection gate 1620N and the P-type selection gate 1620P in an opposite direction to the N-type selection gate 1620N. Thus, the N-type selection gate 1620N may intersect the first active region 1110 in a plane view to overlap with the second channel region 1420, and the P-type selection gate 1620P may be located on the trench isolation layer 1060 without overlapping with the first active region 1110. As illustrated in FIG. 20, a first length L1 of the N-type selection gate 1620N in the second direction may be greater than a second length L2 of the P-type selection gate 1620P in the second direction. The P-type selection gate 1620P may be coupled to the program word line WL_P. The N-type selection gate 1620N may be coupled to the read/erasure word line WL_RE. The P-type selection gate 1620P and the N-type selection gate 1620N may constitute a P-N diode D1. The P-type selection gate 1620P and the N-type selection gate 1620N may correspond to an anode and a cathode of the P-N diode D1, respectively. Thus, the P-type selection gate 1620P may directly receive a bias signal having a certain voltage level from the program word line WL_P, and the N-type selection gate 1620N may directly receive another bias signal having another certain voltage level from the read/erasure word line WL_RE. If a positive bias voltage is applied to the read/erasure word line WL_RE, the P-N diode D1 may be reverse-biased. In such a case, the positive bias voltage applied to the read/erasure word line WL_RE may be transmitted to the N-type selection gate 1620N and may not be transmitted to the P-type selection gate 1620P. In contrast, if a positive bias voltage is applied to the program word line WL_P, the P-N diode D1 may be forward-biased. Accordingly, the positive bias voltage applied to the program word line WL_P may be transmitted to both of the N-type selection gate 1620N and the P-type selection gate 1620P.

The floating gate 1520 may include a first floating gate 1520A and a second floating gate 1520B. The dielectric layer 1700 may include a first dielectric layer 1700A and a second dielectric layer 1700B. The first floating gate 1520A and the first dielectric layer 1700A may overlap with the N-type selection gate 1620N in the first direction. The second floating gate 1520B and the second dielectric layer 1700B may overlap with the P-type selection gate 1620P in the first direction. Thus, a boundary between the first and second floating gates 1520A and 1520B, a boundary between the first and second dielectric layers 1700A and 1700B, and a boundary between the N-type selection gate 1620N and the P-type selection gate 1620P may be located on a straight line parallel with the first direction. The first floating gate 1520A, the first dielectric layer 1700A and the N-type selection gate 1620N, which are laterally stacked, may constitute a first coupling capacitor Cn. Similarly, the second floating gate 1520B, the second dielectric layer 1700B and the P-type selection gate 1620P, which are laterally stacked, may constitute a second coupling capacitor Cp. Thus, the first coupling capacitor Cn and the second coupling capacitor Cp may constitute a total coupling capacitor comprised of the floating gate 1520, the dielectric layer 1700 and the selection gate 1620, which are laterally stacked in the first direction.

The NVM cell 1000 according to the present embodiment may be an example for realizing the equivalent circuit diagram of the NVM cell 2000 shown in FIG. 16. The first N-type junction region 1310, the second N-type junction region 1320, the first channel region 1410, the first gate insulation layer 1510 and the floating gate 1520 may constitute the cell transistor 2100 of FIG. 16. The first N-type junction region 1310 and the second N-type junction region 1320 may correspond to the drain terminal D and the junction terminal J of the cell transistor 2100, respectively. The floating gate 1520 may correspond to the floating gate FG of the cell transistor 2100 shown in FIG. 16. The second N-type junction region 1320, the third N-type junction region 1330, the second channel region 1420, the second gate insulation layer 1610 and the selection gate 1620 may constitute the selection transistor 2200 shown in FIG. 16. The third N-type junction region 1330 may correspond to the source terminal S of the selection transistor 2200 shown in FIG. 16. The selection gate 1620 may correspond to the selection gate terminal SG of the selection transistor 2200 shown in FIG. 16.

Figure 21:
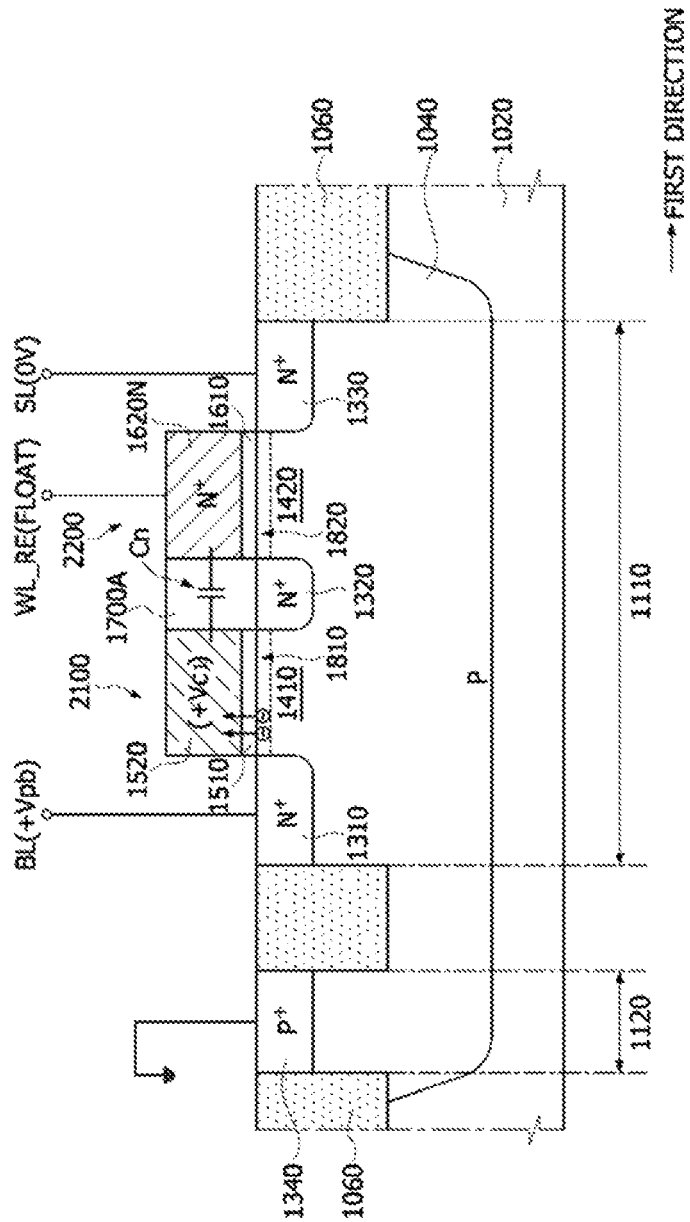
FIGS. 21 and 22 are cross-sectional views illustrating a program operation of a nonvolatile memory cell, according to another embodiment of the present disclosure.
Figure 22:
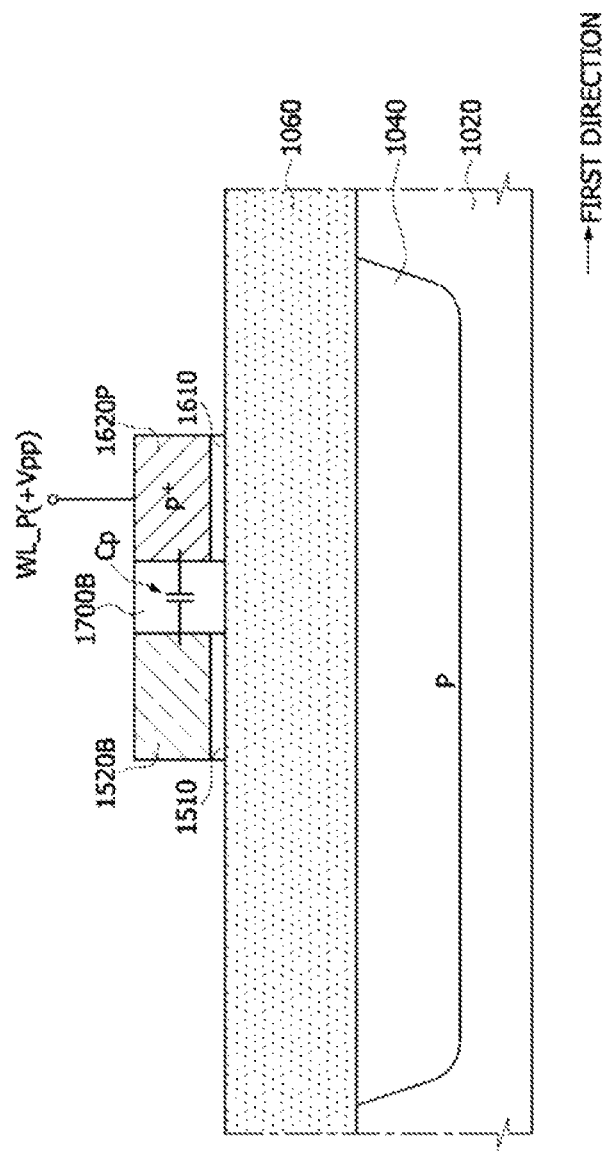
Figure 23:
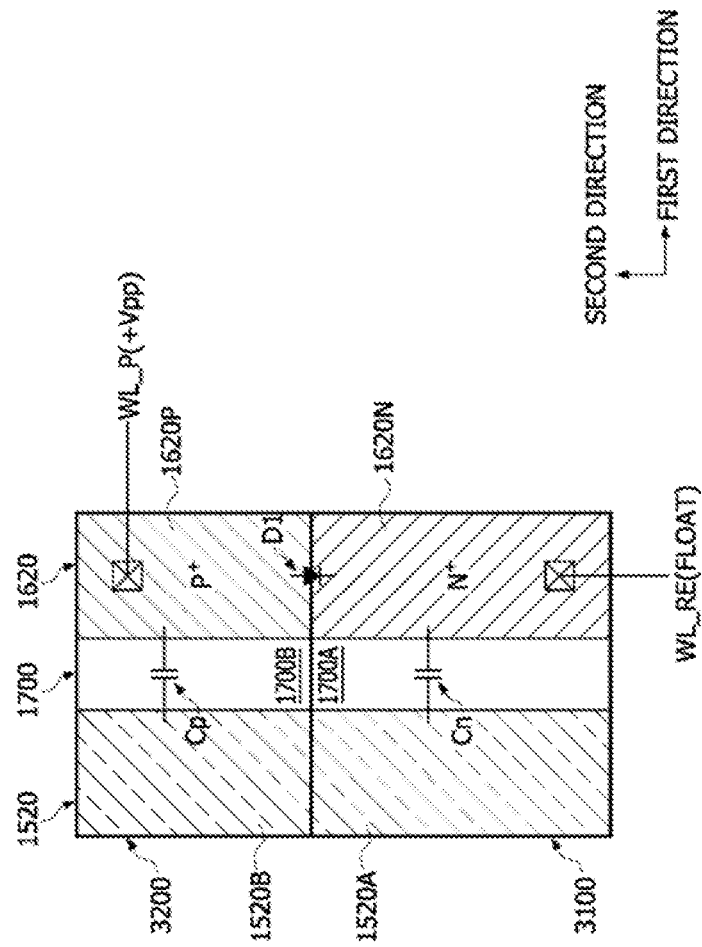
FIG. 23 is a plane view illustrating a coupling mechanism between a selection gate and a floating gate during a program operation of a nonvolatile memory cell, according to another embodiment of the present disclosure.

FIGS. 21 and 22 are cross-sectional views taken along lines IV-IV' and V-V' of FIG. 17 illustrating a program operation of an NVM cell, according to another embodiment of the present disclosure, respectively. FIG. 23 is a plane view illustrating a coupling mechanism between a selection gate and a floating gate during the program operation of the NVM cell shown in FIGS. 21 and 22. The program operation according to the present embodiment may be achieved by a hot electron injection (HEI) mechanism. Referring to FIGS. 21 and 22, to execute the program operation of the NVM cell, a positive program voltage +Vpp may be applied to the program word line WL_P and a positive program bit line voltage +Vpb may be applied to the bit line BL. In addition, a ground voltage may be applied to the source line SL, and the read/erasure word line WL_RE may be electrically floated. In some embodiments, the positive program voltage +Vpp and the positive program bit line voltage +Vpb may be approximately +8 volts and approximately +4 volts, respectively. While the positive program voltage +Vpp is applied to the program word line WL_P, an inversion layer 1820 may be formed in the second channel region 1420 between the second and third N-type junction regions 1320 and 1330. Thus, the selection transistor 2200 may be turned on, and the ground voltage applied to the source line SL may be transmitted to the second N-type junction region 1320 through the inversion layer 1820.

As illustrated in FIG. 23, as the positive program voltage +Vpp is applied to the P-type selection gate 1620P through the program word line WL_P and the read/erasure word line WL_RE is electrically floated, the P-N diode D1 may be forward-biased to act as a short circuit. Thus, the positive program voltage +Vpp applied to the program word line WL_P may be transmitted to both of the P-type selection gate 1620P and the N-type selection gate 1620N. Thus, during the program operation, a coupling voltage induced at the floating gate 1520 may be influenced by the first coupling capacitor Cn, comprised of the first floating gate 1520A, the first dielectric layer 1700A and the N-type selection gate 1620N, as well as the second coupling capacitor Cp, comprised of the second floating gate 1520B, the second dielectric layer 17005 and the P-type selection gate 1620P, as indicated by boxes 3100 and 3200 of FIG. 23. That is, the coupling voltage induced at the floating gate 1520 may be determined by the positive program voltage +Vpp and a cell coupling ratio relating to the first and second coupling capacitors Cn and Cp.

Referring again to FIGS. 21 and 22, a positive coupling program voltage +Vc1 may be induced at the floating gate 1520 under the above bias condition for the program operation, and an inversion layer 1810 may be formed in the first channel region 1410 between the first and second N-type junction regions 1310 and 1320. Accordingly, hot electrons may be generated in the inversion layer 1810 adjacent to the first junction region 1310, and the hot electrons generated in the inversion layer 1810 may be injected into the floating gate 1520 through the first gate insulation layer 1510 due to a vertical electric field which is created by the positive coupling program voltage +Vc1 induced at the floating gate 1520. As the hot electrons are injected into the floating gate 1520, the NVM cell 1000 may be programmed and a threshold voltage of the cell transistor 2100 may become greater than an initial threshold voltage of the cell transistor 2100 before the program operation is performed.

Figure 24:
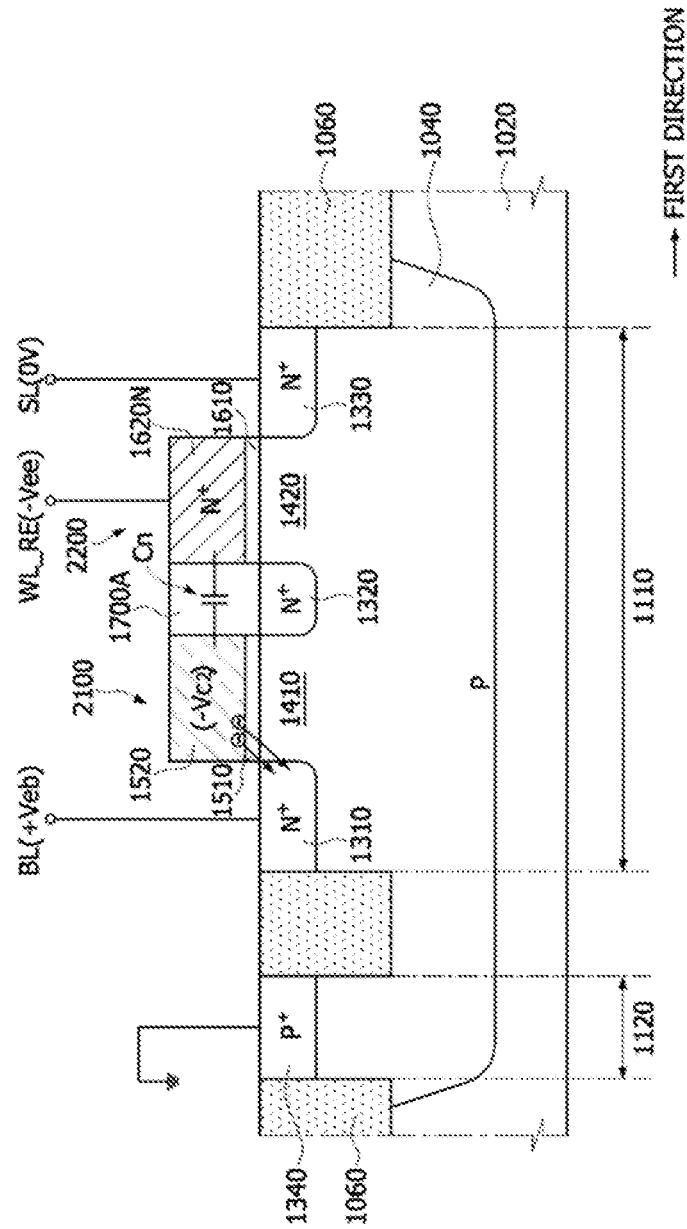
FIG. 24 is a cross-sectional view illustrating an erasure operation of a nonvolatile memory cell, according to another embodiment of the present disclosure.
Figure 25:
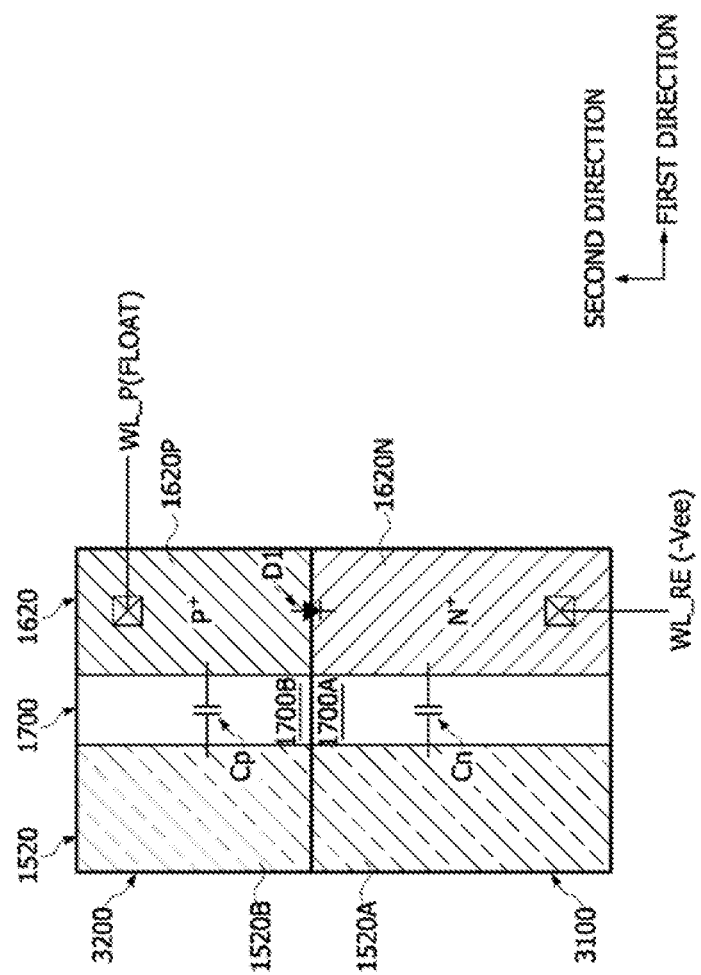
FIG. 25 is a plane view illustrating a coupling mechanism between a selection gate and a floating gate during an erasure operation of a nonvolatile memory cell, according to another embodiment of the present disclosure.

FIG. 24 is a cross-sectional view taken along a line IV-IV' of FIG. 17 illustrating an erasure operation of an NVM cell, according to another embodiment of the present disclosure, and FIG. 25 is a plane view illustrating a coupling mechanism between a selection gate and a floating gate during the erasure operation of the NVM cell. The erasure operation according to the present embodiment may be achieved by a band-to-band tunneling (BTBT) mechanism. Referring to FIG. 24, to execute the erasure operation of the NVM cell, a negative erasure voltage −Vee may be applied to the read/erasure word line WL_RE and a positive erasure bit line voltage +Veb may be applied to the bit line BL. In addition, a ground voltage may be applied to the source line SL, and the program word line WLP may be electrically floated. In some embodiments, the negative erasure voltage −Vee and the positive erasure bit line voltage +Veb may be approximately −8 volts and approximately +5 volts, respectively. As the negative erasure voltage −Vee is applied to the read/erasure word line WL_RE, the selection transistor 2200 may be turned off. Thus, the second N-type junction region 1320 may be electrically floated.

As illustrated in FIG. 25, as the negative erasure voltage −Vee is applied to the N-type selection gate 1620N through the read/erasure word line WL_RE and the program word line WL_P is electrically floated, the P-N diode D1 may be forward-biased to act as a short circuit. Thus, the negative erasure voltage −Vee may be applied to both of the N-type selection gate 1620N and the P-type selection gate 1620P. Accordingly, during the erasure operation, a coupling voltage induced at the floating gate 1520 may be influenced by the first coupling capacitor Cn, comprised of the first floating gate 1520A, the first dielectric layer 1700A and the N-type selection gate 1620N, as well as the second coupling capacitor Cp, comprised of the second floating gate 1520B, the second dielectric layer 1700B and the P-type selection gate 1620P, as indicated by the boxes 3100 and 3200 of FIG. 25. That is, the coupling voltage induced at the floating gate 1520 may be determined by the negative erasure voltage −Vee and a cell coupling ratio relating to the first and second coupling capacitors Cn and Cp.

Referring again to FIG. 24, a negative coupling erasure voltage −Vc2 may be induced at the floating gate 1520 under the above bias condition for the erasure operation, and no inversion layer may be formed in the first channel region 1410 between the first and second N-type junction regions 1310 and 1320. Since the positive erasure bit line voltage +Veb is applied to the first N-type junction region 1310 through the bit line BL, a depletion region may be formed in a junction region between the first channel region 1410 and the first N-type junction region 1310. Accordingly, a deep energy band bending phenomenon may occur in the junction region between the first channel region 1410 and the first N-type junction region 1310 which is greater than an energy band gap of a material of the junction region. As a result, electrons in the floating gate 1520 may be injected into the first N-type junction region 1310 through the first gate insulation layer 1510 by a tunneling mechanism. As the electrons in the floating gate 1520 are injected into the first N-type junction region 1310, the NVM cell 1000 may be erased and a threshold voltage of the erased cell transistor 2100 may become less than a threshold voltage of the programmed cell transistor 2100.

Figure 26:
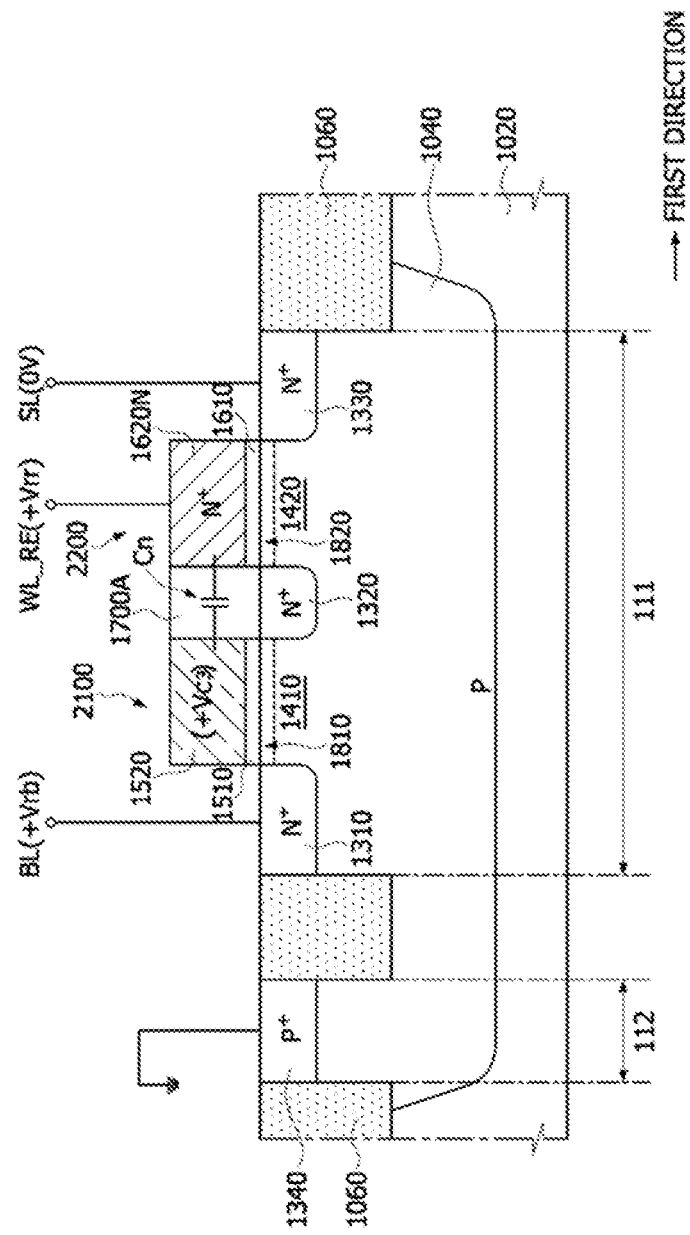
FIG. 26 is a cross-sectional view illustrating a read operation of a nonvolatile memory cell, according to another embodiment of the present disclosure.
Figure 27:
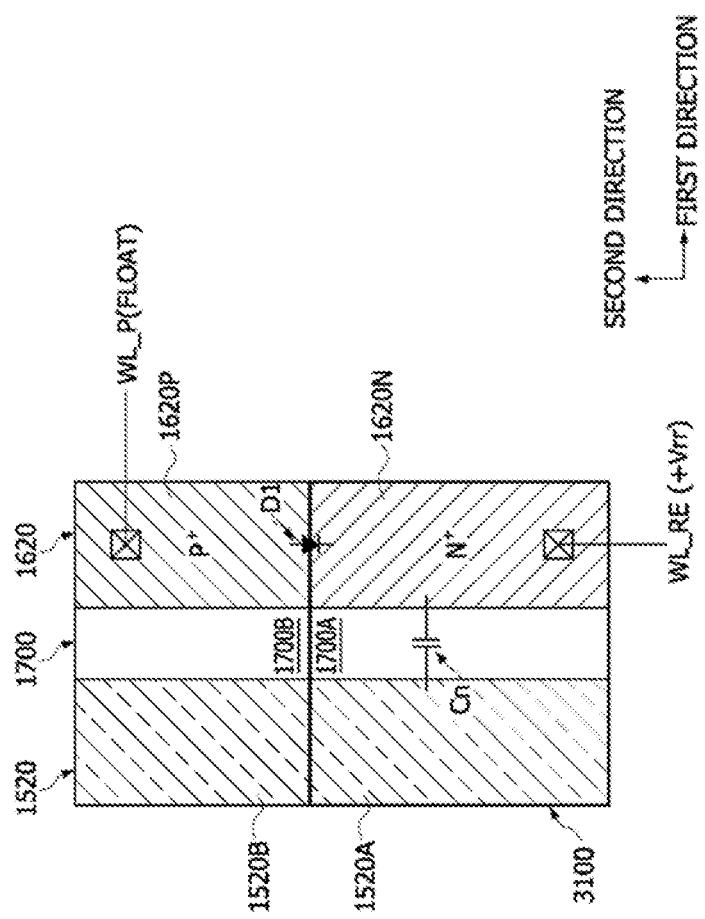
FIG. 27 is a plane view illustrating a coupling mechanism between a selection gate and a floating gate during a read operation of a nonvolatile memory cell, according to another embodiment of the present disclosure.

FIG. 26 is a cross-sectional view taken along a line IV-IV' of FIG. 17 illustrating a read operation of an NVM cell, according to another embodiment of the present disclosure, and FIG. 27 is a plane view illustrating a coupling mechanism between a selection gate and a floating gate during the read operation of the NVM cell. Referring to FIG. 26, to execute the read operation of the NVM cell, a positive read voltage +Vrr may be applied to the read/erasure word line WL_RE and a positive read bit line voltage +Vrb may be applied to the bit line BL. In addition, a ground voltage may be applied to the source line SL, and the program word line WL_P may be electrically floated. The positive read voltage +Vrr may be less than a threshold voltage of the cell transistor 2100 having a programmed status and may be greater than a threshold voltage of the cell transistor 2100 having an erased status. In some embodiments, the positive read voltage +Vrr and the positive read bit line voltage +Vrb may be approximately +3.3 volts and approximately +1 volt, respectively. While the positive read voltage +Vrr is applied to the read/erasure word line WL_RE, an inversion layer 1820 may be formed in the second channel region 1420 between the second and third N-type junction regions 1320 and 1330. Thus, the selection transistor 2200 may be turned on, and the ground voltage applied to the source line SL may be transmitted to the second N-type junction region 1320 through the inversion layer 1820.

As illustrated in FIG. 27, as the positive read voltage +Vrr is applied to the N-type selection gate 1620N through the read/erasure word line WL_RE and the program word line WL_P is electrically floated, the P-N diode D1 may be reverse-biased to act as an open circuit. Thus, the positive read voltage +Vrr may be applied only to the N-type selection gate 1620N and may not be transmitted to the P-type selection gate 1620P. Accordingly, during the read operation, a coupling voltage induced at the floating gate 1520 may be influenced by the first coupling capacitor Cn, comprised of the first floating gate 1520A, the first dielectric layer 1700A and the N-type selection gate 1620N, without the second coupling capacitor Cp. That is, the coupling voltage induced at the floating gate 1520 may be determined by the positive read voltage +Vrr and a cell coupling ratio relating to the first coupling capacitor Cn without the second coupling capacitor Cp.

If a positive coupling read voltage +Vc3 is induced at the floating gate 1520 under the above bias condition for the read operation, whether or not an inversion layer 1810 may be formed in the first channel region 1410 depends upon a threshold voltage of the cell transistor 2100. For example, if the cell transistor 2100 has a programmed status, no inversion layer may be formed in the first channel region 1410 even though the positive coupling read voltage +Vc3 is induced at the floating gate 1520 under the above bias condition for the read operation. Thus, no current may flow through the bit line BL and the source line SL. On the contrary, if the cell transistor 2100 has an erased status, an inversion layer 1810 may be formed in the first channel region 1410 since the positive coupling read voltage +Vc3 is induced at the floating gate 1520 under the above bias condition for the read operation. Thus, a certain current may flow through the bit line BL having a voltage level of the positive read bit line voltage +Vrb and the source line SL having a ground voltage. Accordingly, the status that is, information of the NVM cell 1000 may be read out by sensing a current flowing through the bit line BL.

Figure 28:
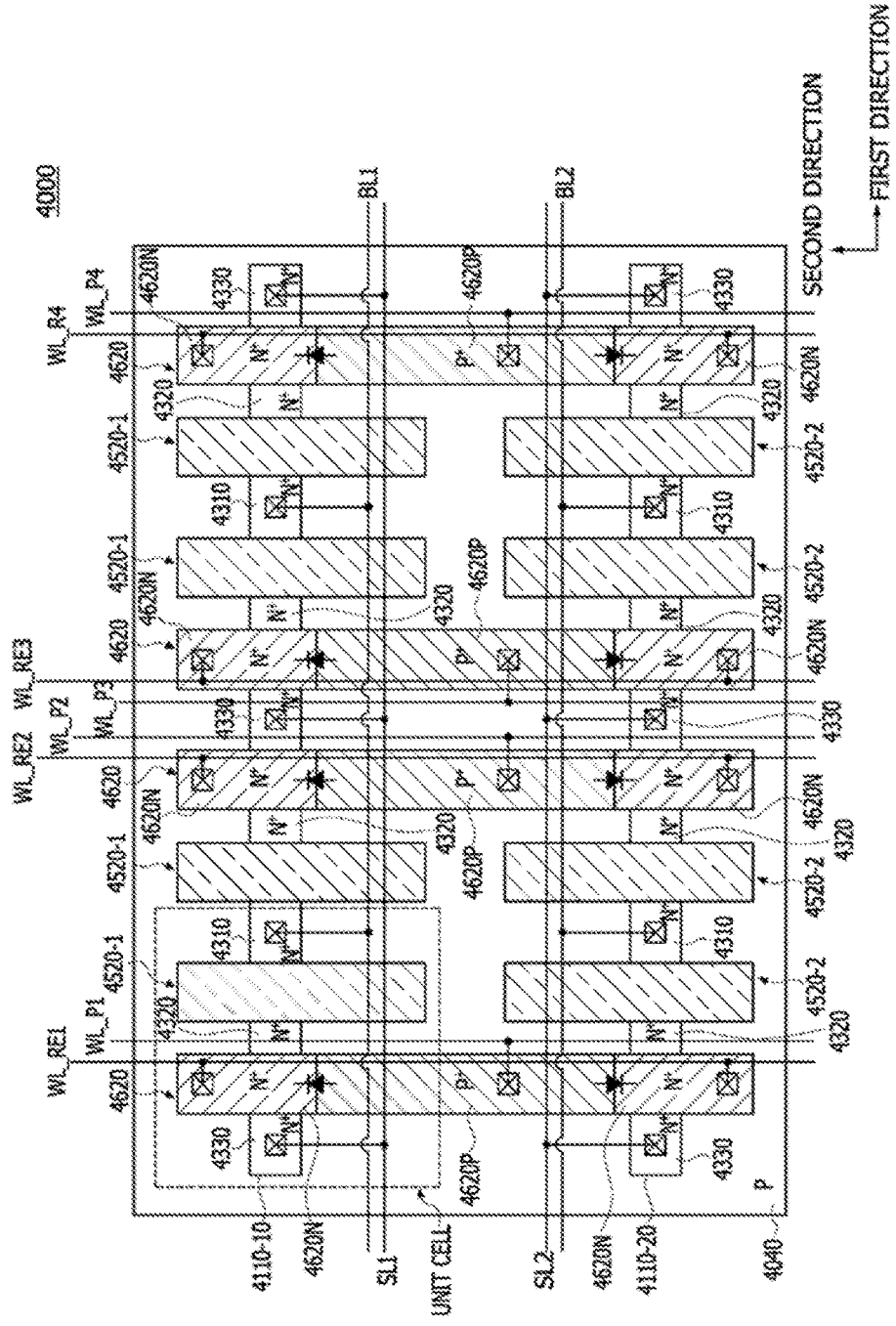
FIG. 28 is a layout diagram illustrating a nonvolatile memory cell array according to another embodiment of the present disclosure.

FIG. 28 is a layout diagram illustrating an NVM cell array 4000, according to another embodiment of the present disclosure. The NVM cell array 4000 may include a plurality of unit cells UNIT CELL which are located at cross points of two rows and four columns to have a '2×4' matrix form. However, the NVM cell array 4000 shown in FIG. 28 is merely an example of suitable NVM cell arrays. Thus, in some embodiments, the NVM cell array 4000 may include a plurality of unit cells which are located at cross points of three or more rows and five or more columns. Referring to FIG. 28, a first active region 4110-10 and a second active region 4110-20 may be disposed in a P-type well region 4040. All of the unit cells of the NVM cell array 4000 may share the P-type well region 4040 with each other. The P-type well region 4040 may be grounded during a program operation, an erasure operation and a read operation of the NVM cell array 4000. Each of the first and second active regions 4110-10 and 4110-20 may have a stripe shape extending in a first direction. The first and second active regions 4110-10 and 4110-20 may be spaced apart from each other in a second direction intersecting the first direction. The first and second directions may be substantially perpendicular to one another as illustrated in FIG. 28. However, the disclosure is not limited in this way. Although not shown in FIG. 28, the first and second active regions 4110-10 and 4110-20 may be defined by a trench isolation layer. The unit cells UNIT CELL arrayed in a first row may share the first active region 4110-10 with each other, and the unit cells UNIT CELL arrayed in a second row may share the second active region 4110-20 with each other.

A plurality of selection gates 4620 may be spaced apart from each other in the first direction. Each of the selection gates 4620 may have a stripe shape extending in the second direction in a plan view. Thus, each of the selection gates 4620 may intersect the first and second active regions 4110-10 and 4110-20. Each of the selection gates 4620 may be coupled to the unit cells arrayed in any one of the columns. Each of the selection gates 4620 may be configured to include a pair of N-type selection gates 4620N and a P-type selection gate 4620P disposed between the pair of N-type selection gates 4620N which are arrayed in the second direction. In each selection gate 4620, one of the pair of N-type selection gates 4620N may overlap with the first active region 4110-10 and the other of the pair of N-type selection gates 4620N may overlap with the second active region 4110-20. The N-type selection gates 4620N overlapping with the first active region 4110-10 may be coupled to the unit cells arrayed in the first row, respectively. Similarly, the N-type selection gates 4620N overlapping with the second active region 4110-20 may be coupled to the unit cells arrayed in the second row, respectively. In each selection gate 4620, since the P-type selection gate 4620P is disposed between the pair of N-type selection gates 4620N, the P-type selection gate 4620P may not overlap with any of the first and second active regions 4110-10 and 4110-20. In each column, the P-type selection gate 4620P may be coupled to both of the unit cell arrayed in the first row and the unit cell arrayed in the second row. In each selection gate 4620, the P-type selection gate 4620P and one of the N-type selection gates 4620N may constitute a P-N diode. The P-type selection gate 4620P disposed in each column may be coupled to any one of program word lines WL_P1~WL_P4. The N-type selection gates 4620N disposed in each column may be coupled to any one of read/erasure word lines WL_RE1~WL_RE4.

A plurality of first floating gates 4520-1 may be arrayed in the first row spaced apart from each other in the first direction. A plurality of second floating gates 4520-2 may be arrayed in the second row spaced apart from each other in the first direction. The first floating gate 4520-1 and the second floating gate 4520-2 disposed in each column may be spaced apart from each other in the second direction. The first floating gates 4520-1 may intersect the first active region 4110-10 to be parallel with the selection gates 4620. Although not shown in FIG. 28, in each of the unit cells arrayed in the first row, a dielectric layer may be disposed between the first floating gate 4520-1 and the selection gate 4620 adjacent to each other. Thus, the first floating gate 4520-1, the selection gate 4620, and the dielectric layer therebetween may constitute a coupling capacitor. The second floating gates 4520-2 may intersect the second active region 4110-20 to be parallel with the selection gates 4620. Although not shown in FIG. 28, in each of the unit cells arrayed in the second row, a dielectric layer may also be disposed between the second floating gate 4520-2 and the selection gate 4620 adjacent to each other. Thus, the second floating gate 4520-2, the selection gate 4620, and the dielectric layer therebetween may constitute a coupling capacitor.

Each of the unit cells may include a first N-type junction region 4310, a second N-type junction region 4320 and a third N-type junction region 4330 which are disposed in the first active region 4110-10 or the second active region 4110-20. The second N-type junction region 4320 may be disposed in the first active region 4110-10 or the second active region 4110-20 between the selection gate 4620 and the first floating gate 4520-1 or the second floating gate 4520-2. The first N-type junction region 4310 may be disposed in the first active region 4110-10 or the second active region 4110-20 adjacent to a sidewall of the first floating gate 4520-1 or the second floating gate 4520-2 opposite to the second N-type junction region 4320, and the third N-type junction region 4330 may be disposed in the first active region 4110-10 or the second active region 4110-20 adjacent to a sidewall of the selection gate 4620 opposite to the second N-type junction region 4320. The first N-type junction region 4310 and the third N-type junction region 4330 in the first active region 4110-10 may be coupled to a first bit line BL1 and a first source line SL1, respectively. The first N-type junction region 4310 and the third N-type junction region 4330 in the second active region 4110-20 may be coupled to a second bit line BL2 and a second source line SL2, respectively.

Figure 29:
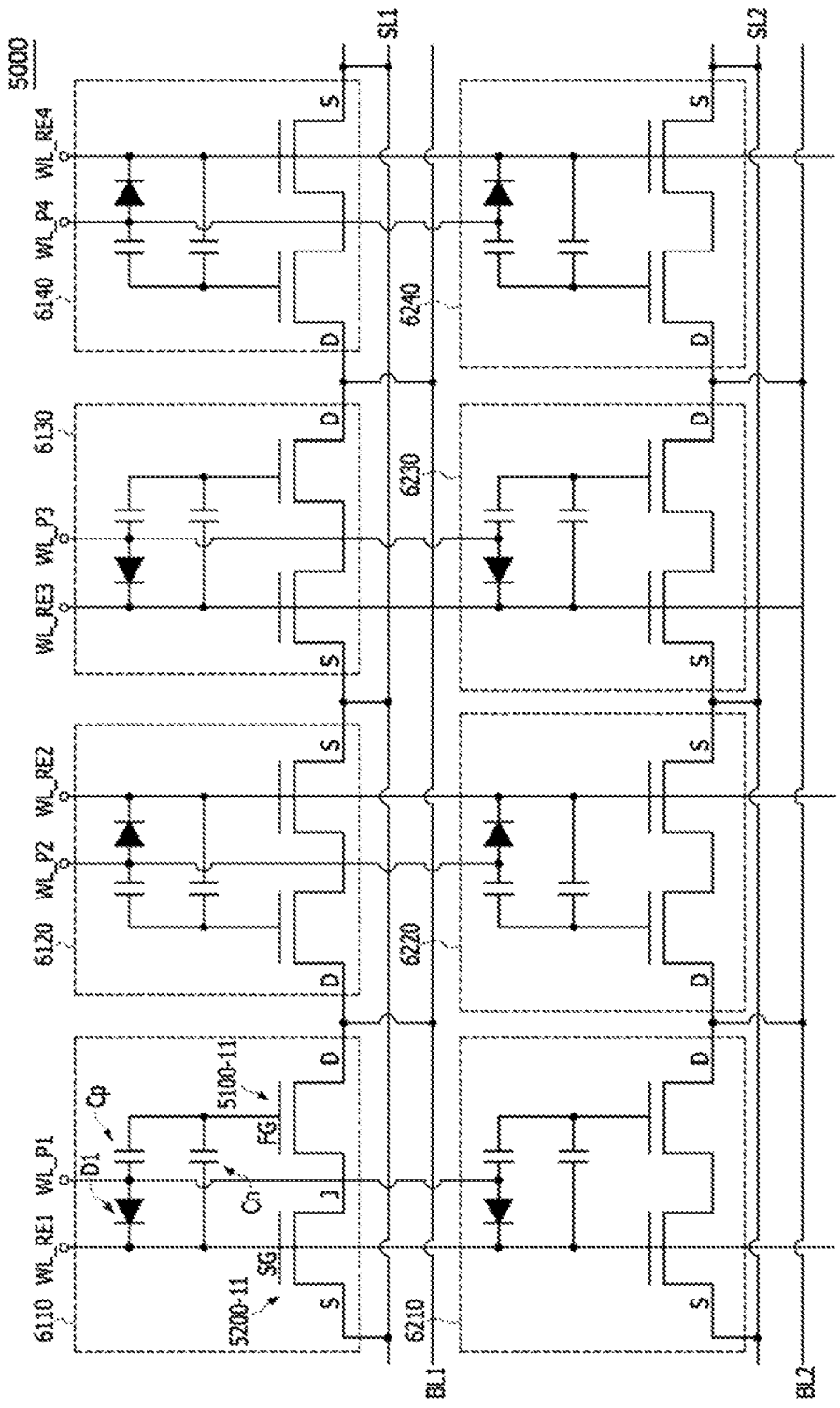
FIG. 29 is an equivalent circuit diagram illustrating a nonvolatile memory cell array according to another embodiment of the present disclosure.

FIG. 29 is an equivalent circuit diagram illustrating an NVM cell array 5000 according to another embodiment of the present disclosure. Referring to FIG. 29, the equivalent circuit diagram of the NVM cell array 5000 may include a plurality of unit cells 6110~6140 and 6210~6240 which are located at cross points of two rows and four columns to have a '2×4' matrix form. However, the equivalent circuit diagram of the NVM cell array 5000 shown in FIG. 29 is merely an example of suitable equivalent circuit diagrams for various NVM cell arrays. Thus, in some embodiments, the equivalent circuit diagram of the NVM cell array 5000 may include a plurality of unit cells which are located at cross points of three or more rows and five or more columns. The rows may be distinguished by bit lines BL1 and BL2 or source lines SL1 and SL2, and the columns may be distinguished by program word lines WL_P1~WL_P4 or read/erasure word lines WL_RE1~WL_RE4. The plurality of unit cells 6110~6140 and 6210~6240 may have the same configuration. For example, the unit cell 6110 located at a cross point of the first row and the first column may include a cell transistor 5100-11 and a selection transistor 5200-11. Each of the cell transistor 5100-11 and the selection transistor 5200-11 may be realized using an N-channel MOS transistor. The cell transistor 5100-11 may have a floating gate FG, a junction terminal J and a drain terminal D. The selection transistor 5200-11 may have a selection gate terminal SG, the junction terminal J and a source terminal S. The source terminal S and the drain terminal D may be coupled to the first source line SL1 and the first bit line BL1, respectively. The junction terminal J may be electrically isolated to have a floating status. The selection gate terminal SG may be coupled to the first read/erasure word line WL_RE1 and the first program word line WL_P1. The first read/erasure word line WL_RE1 may be directly connected to the selection gate terminal SG. The first program word line WL_P1 may be indirectly connected to the selection gate terminal SG through a P-N diode D1. A first coupling capacitor Cn and a second coupling capacitor Cp may be coupled in parallel between the floating gate FG and the selection gate terminal SG. The P-N diode D1 may be coupled between the selection gate terminal SG and the second coupling capacitor Cp. An anode of the P-N diode D1 may be coupled to the first program word line WL_P1 and the second coupling capacitor Cp, and a cathode of the P-N diode D1 may be coupled to the selection gate terminal SG and the first read/erasure word line WL_RE1.

The respective source terminals S of the unit cells 6110~6140 arrayed in the first row may be coupled to the first source line SL1 in common. The respective drain terminals D of the unit cells 6110~6140 arrayed in the first row may be coupled to the first bit line BL1 in common. The respective source terminals S of the unit cells 6210~6240 arrayed in the second row may be coupled to the second source line SL2 in common. The respective drain terminals D of the unit cells 6210~6240 arrayed in the second row may be coupled to the second bit line BL2 in common. The respective selection gate terminals SG of the unit cells 6110 and 6210 arrayed in the first column may be coupled to the first read/erasure word line WL_RE1 in common and may also be coupled to the first program word line WL_P1 in common. The respective selection gate terminals SG of the unit cells 6120 and 6220 arrayed in the second column may be coupled to the second read/erasure word line WL_RE2 in common and may also be coupled to the second program word line WL_P2 in common. The respective selection gate terminals SG of the unit cells 6130 and 6230 arrayed in the third column may be coupled to the third read/erasure word line WL_RE3 in common and may also be coupled to the third program word line WL_P3 in common. The respective selection gate terminals SG of the unit cells 6140 and 6240 arrayed in the fourth column may be coupled to the fourth read/erasure word line WL_RE4 in common and may also be coupled to the fourth program word line WL_P4 in common.

Figure 30:
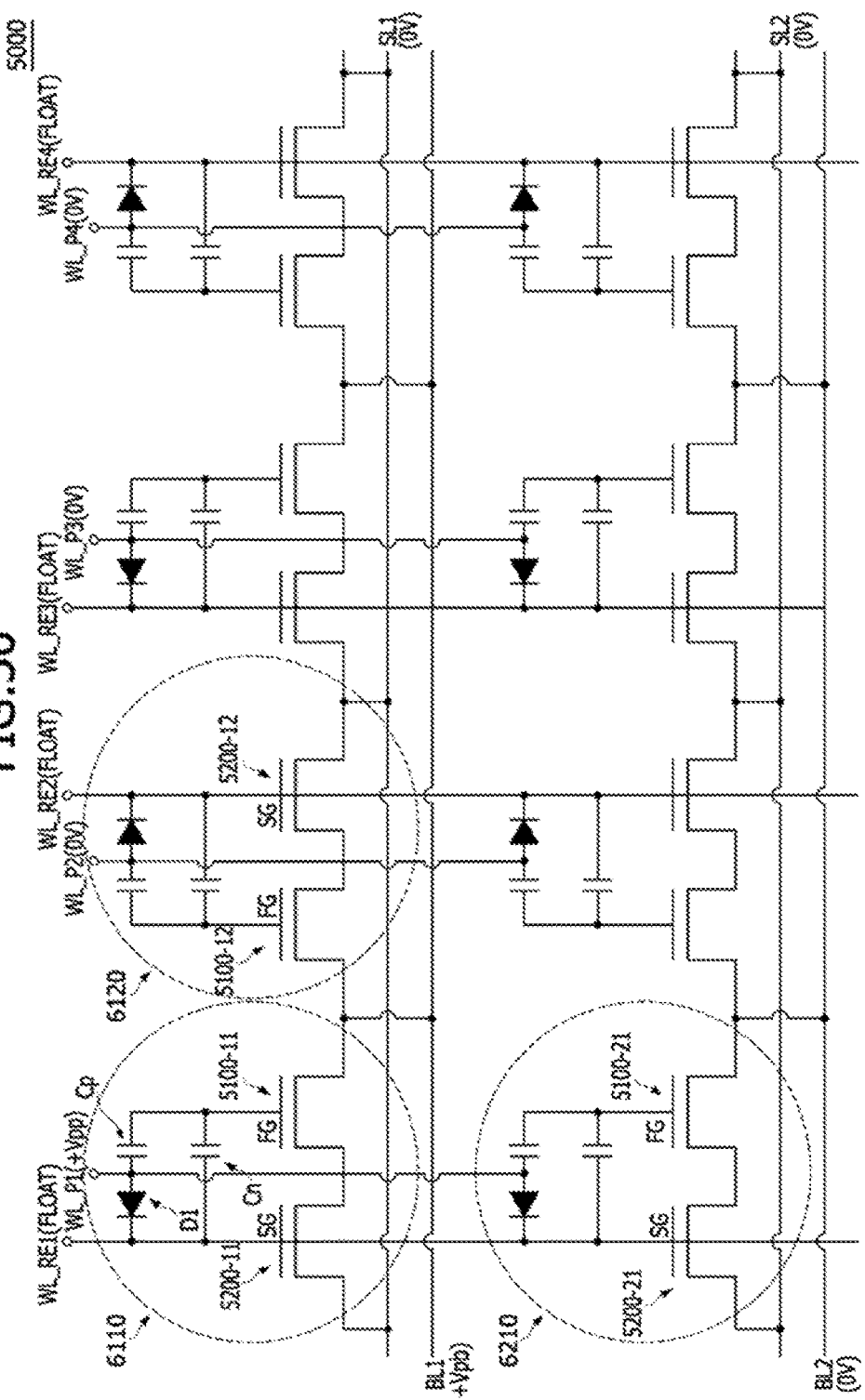
FIG. 30 is an equivalent circuit diagram illustrating a program operation of a selected unit cell in a nonvolatile memory cell array according to another embodiment of the present disclosure.

FIG. 30 is an equivalent circuit diagram illustrating a program operation of a selected unit cell 6110 in an NVM cell array, according to another embodiment of the present disclosure. In FIG. 30, the same reference numerals or designators as used in FIG. 29 denote the same elements. Referring to FIG. 30, to selectively program the unit cell 6110 located at a cross point of the first row and the first column, a positive program voltage +Vpp may be applied to the first program word line WL_P1 connected to the selected unit cell 6110. The remaining program word lines WL_P2, WL_P3 and WL_P4 may be grounded. In addition, all of the read/erasure word lines WL_RE1~WL_RE4 may be electrically floated. Moreover, a positive program bit line voltage +Vpb and a ground voltage may be applied to the first bit line BL1 and the first source line SL1 connected to the selected unit cell 6110, respectively. The remaining bit line BL2 and the remaining source line SL2 may be grounded. The positive program voltage +Vpp applied to the first program word line WL_P1 may be transmitted to the selection gate terminal SG of the selection transistor 5200-11 to turn on the selection transistor 5200-11. If the positive program voltage +Vpp is transmitted to the selection gate terminal SG, a positive coupling voltage may be induced at the floating gate FG of the cell transistor 5100-11 due to the presence of the first and second coupling capacitors Cn and Cp coupled in parallel between the selection gate terminal SG and the floating gate FG of the selected unit cell 6110. In such a case, the P-N diode D1 of the selected unit cell 6110 may be forward-biased to provide a short circuit. Under the above bias condition, the cell transistor 5100-11 may be programmed by a hot electron injection (HEI) mechanism.

Regarding the non-selected unit cells for example, the unit cell 6120 located at a cross point of the first row and the second column, sharing the first bit line BL1 and the first source line SL1 with the selected unit cell 6110, the selection transistor 5200-12 may be turned off since the second program word line WL_P2 is grounded and a coupling voltage corresponding to approximately the ground voltage may be induced at the floating gate FG of the cell transistor 5100-12. This is due to a P-type well region corresponding to a bulk region of all of the cell transistors being grounded, as described with reference to FIG. 28. Thus, programming of the unit cell 6120 is prohibited. Regarding the non-selected unit cells for example, the unit cell 6210 located at a cross point of the second row and the first column, sharing the first program word line WL_P1 with the selected unit cell 6110, a positive coupling voltage may be induced at the floating gate FG of the cell transistor 5100-21 since the positive program voltage +Vpp is applied to the first program word line WL_P1. Thus, both of the cell transistor 5100-21 and the selection transistor 5200-21 may be turned on. However, no hot electrons may be generated in the cell transistor 5100-21 since there is no electric potential difference between the second bit line BL2 and the second source line SL2. Accordingly, programming of the unit cell 6210 is prohibited.

Figure 31:
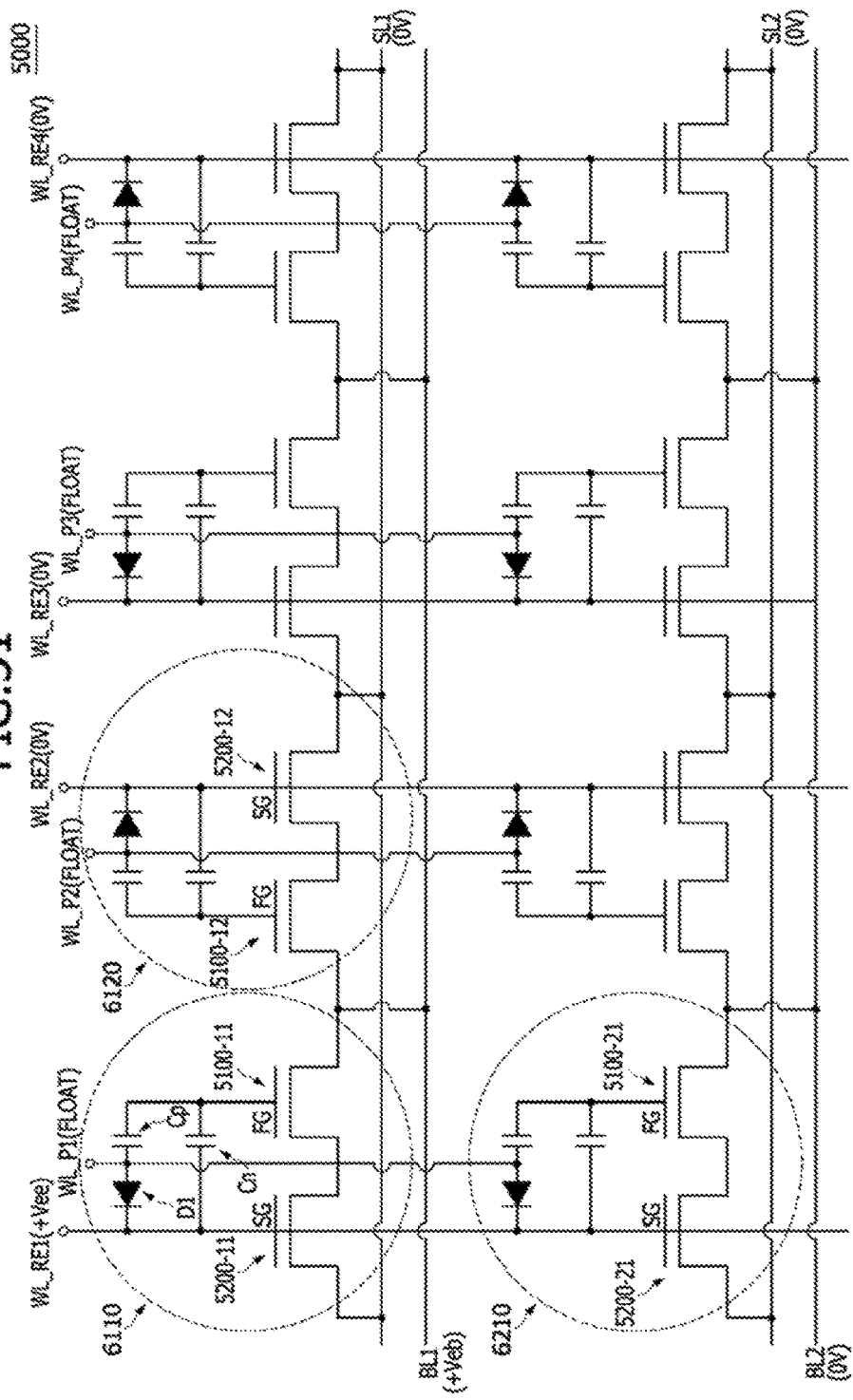
FIG. 31 is an equivalent circuit diagram illustrating an erasure operation of a selected unit cell in a nonvolatile memory cell array according to another embodiment of the present disclosure.

FIG. 31 is an equivalent circuit diagram illustrating an erasure operation of a selected unit cell 6110 in an NVM cell array, according to another embodiment of the present disclosure. In FIG. 31, the same reference numerals or designators as used in FIG. 29 denote the same elements. Referring to FIG. 31, to selectively erase the unit cell 6110 located at a cross point of the first row and the first column, a negative erasure voltage –Vee may be applied to the first read/erasure word line WL_RE1 connected to the selected unit cell 6110. The remaining read/erasure word lines WL_RE2, WL_RE3 and WL_RE4 may be grounded. In addition, all of the program word lines WL_P1~WL_P4 may be electrically floated. Moreover, a positive erasure bit line voltage +Veb and a ground voltage may be applied to the first bit line BL1 and the first source line SL1 connected to the selected unit cell 6110, respectively. The remaining bit line BL2 and the remaining source line SL2 may be grounded. By applying the negative erasure voltage –Vee to the selection gate terminal SG of the selection transistor 5200-11 through the first read/erasure word line WL_RE1, the P-N diode D1 of the selected unit cell 6110 may be forward-biased to provide a short circuit. Thus, the floating gate FG of the cell transistor 5100-11 may be coupled to the first read/erasure word line WL_RE1 through both of the first and second coupling capacitors Cn and Cp, and a negative coupling voltage may be induced at the floating gate FG of the cell transistor 5100-11. In such a case, the cell transistor 5100-11 may be erased by a band-to-band tunneling (BTBT) mechanism which is due to a voltage difference between the negative coupling voltage induced at the floating gate FG and the positive erasure bit line voltage +Veb applied to the first bit line BL1.

Regarding the non-selected unit cells for example, the unit cell 6120 located at a cross point of the first row and the second column, sharing the first bit line BL1 and the first source line SL1 with the selected unit cell 6110, the selection transistor 5200-12 may be turned off since the second read/erasure word line WL_RE2 is grounded and a coupling voltage corresponding to approximately the ground voltage may be induced at the floating gate FG of the cell transistor 5100-12. This is due to a P-type well region corresponding to a bulk region of all of the cell transistors being grounded, as described with reference to FIG. 28. Thus, a voltage difference between the floating gate FG of the cell transistor 5100-12 and the first bit line BL1 may correspond to only the positive erasure bit line voltage +Veb. This voltage difference corresponding to the positive erasure bit line voltage +Veb is too small to cause the BTBT phenomenon in the cell transistor 5100-12. Accordingly, the erasure of the unit cell 6120 is prohibited. Regarding the non-selected unit cells for example, the unit cell 6210 located at a cross point of the second row and the first column, sharing the first read/erasure word line WL_RE1 with the selected unit cell 6110, a negative coupling voltage may be induced at the floating gate FG of the cell transistor 5100-21 since the negative erasure voltage -Vee is applied to the first read/erasure word line WL_RE1. However, since the second bit line BL2 is grounded, a voltage difference between the floating gate FG of the cell transistor 5100-21 and the second bit line BL2 may correspond to only the negative erasure voltage -Vee. This voltage difference corresponding to the negative erasure voltage -Vee is too small to cause the BTBT phenomenon in the cell transistor 5100-21. Accordingly, the erasure of the unit cell 6210 is prohibited.

Although FIG. 31 illustrates an example in which any one for example, the unit cell 6110 located at a cross point of the first row and the first column, among the plurality of unit cells is selectively erased, all of the plurality of unit cells may be erased in bulk if necessary. To execute a bulk erasure operation, the negative erasure voltage -Vee may be applied to all of the read/erasure word lines WL_RE1~WL_RE4 and the positive erasure bit line voltage +Veb may be applied to all of the bit lines BL1 and BL2. In addition, all of the source lines SL1 and SL2 may be grounded, all of the program word lines WL_P1~WL_P4 may be electrically floated. Under the above bias condition, all of the cell transistors of the plurality of unit cells may be erased by a BTBT mechanism in bulk.

Figure 32:
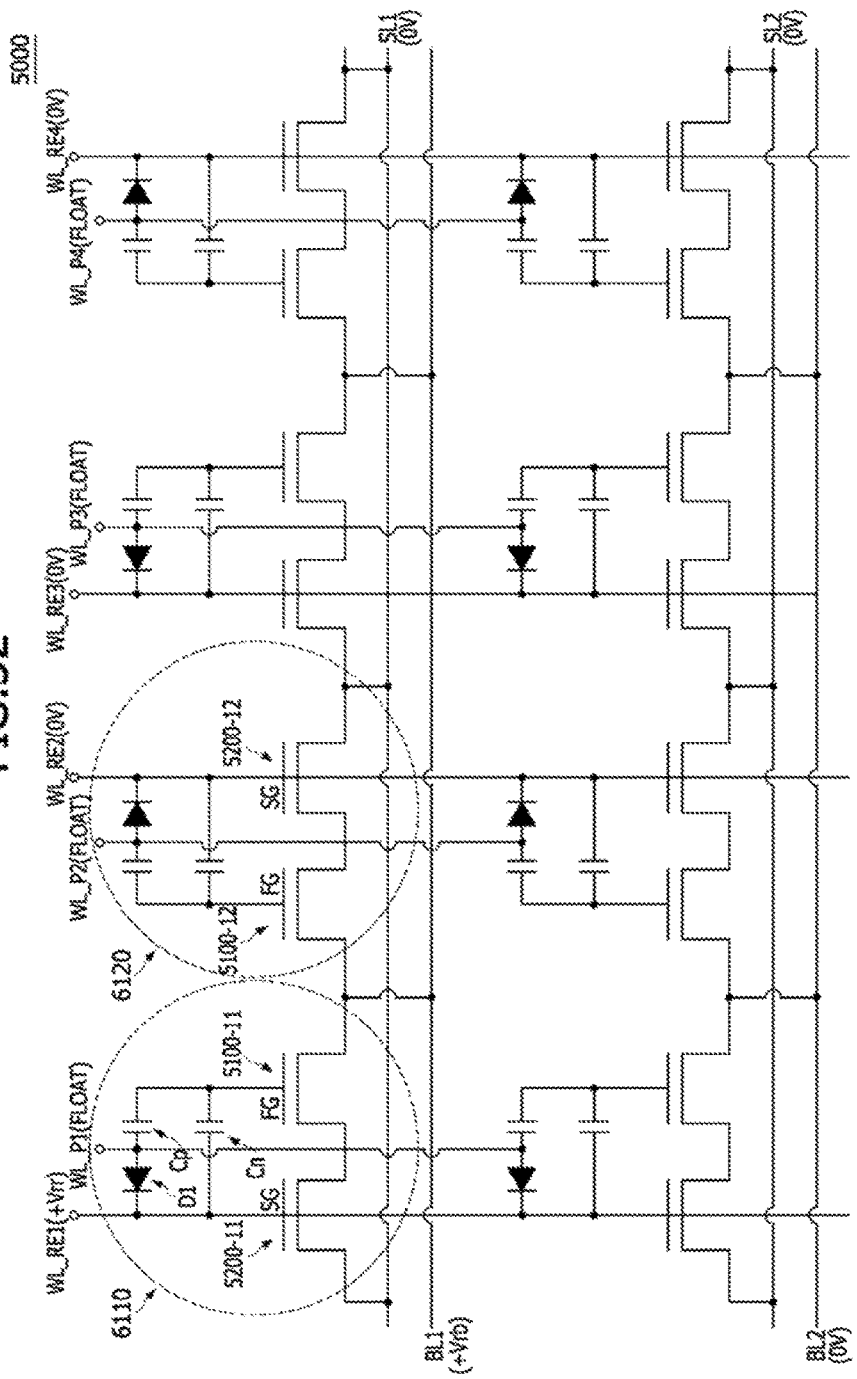
FIG. 32 is an equivalent circuit diagram illustrating a read operation of a selected unit cell in a nonvolatile memory cell array according to another embodiment of the present disclosure.

FIG. 32 is an equivalent circuit diagram illustrating a read operation of a selected unit cell 6110 in an NVM cell array, according to another embodiment of the present disclosure. In FIG. 32, the same reference numerals or designators as used in FIG. 29 denote the same elements. Referring to FIG. 32, to selectively read out information stored in the unit cell 6110 located at a cross point of the first row and the first column, a positive read voltage +Vrr may be applied to the first read/erasure word line WL_RE1 connected to the selected unit cell 6110. The remaining read/erasure word lines WL_RE2, WL_RE3 and WL_RE4 may be grounded. In addition, all of the program word lines WL_P1~WL_P4 may be electrically floated. Moreover, a positive read bit line voltage +Vrb and a ground voltage may be applied to the first bit line BL1 and the first source line SL1 connected to the selected unit cell 6110, respectively. The remaining bit line BL2 and the remaining source line SL2 may be grounded.

As the positive read voltage +Vrr is applied to the first read/erasure word line WL_RE1, the selection transistor 5200-11 may be turned on and a positive coupling voltage may be induced at the floating gate FG of the cell transistor 5100-11 by a coupling operation of the first coupling capacitor Cn between the first read/erasure word line WL_RE1 and the floating gate FG. In such a case, the P-N diode D1 of the selected unit cell 6110 may be reverse-biased to provide an open circuit. Thus, the second coupling capacitor Cp of the selected unit cell 6110 does not affect the coupling operation between the first read/erasure word line WL_RE1 and the floating gate FG. As the positive coupling voltage is induced at the floating gate FG of the cell transistor 5100-11, the cell transistor 5100-11 may be turned on or turned off according to a threshold voltage of the cell transistor 5100-11. For example, if the cell transistor 5100-11 has a programmed status, the cell transistor 5100-11 may be turned off under the above read bias condition. In contrast, if the cell transistor 5100-11 has an erased status, the cell transistor 5100-11 may be turned on under the above read bias condition. If the cell transistor 5100-11 is turned off, no current flows through the first bit line BL1 and the first source line SL1. However, if the cell transistor 5100-11 is turned on, a current flows through the first bit line BL1 and the first source line SL1 due to an electric potential difference corresponding to the positive read bit line voltage +Vrb existing between the first bit line BL1 and the first source line SL1. Accordingly, the information of the cell transistor 5100-11 of the selected unit cell 6110 may be read out by sensing the current flowing through the first bit line BL1 and the first source line SL1.

Regarding the non-selected unit cells for example, the unit cell 6120 located at a cross point of the first row and the second column, sharing the first bit line BL1 and the first source line SL1 with the selected unit cell 6110, both of the cell transistor 5100-12 and the selection transistor 5200-12 of the unit cell 6120 may be turned off since the second read/erasure word line WL_RE2 is grounded. Thus, no current flows through the unit cell 6120, and the unit cell 6120 does not affect the read operation of the selected unit cell 6110.

The embodiments of the present disclosure which have been disclosed above are for illustrative purposes. Those of ordinary skill in the art will appreciate that various modifications, additions, and substitutions are possible, without departing from the scope and spirit of the present disclosure as disclosed in the accompanying claims.

What is claimed is:
1. A nonvolatile memory (NVM) cell comprising:
   a selection transistor configured to have a selection gate terminal coupled to a word line and a source terminal coupled to a source line;
   a cell transistor configured to have a floating gate electrically isolated, a drain terminal coupled to a bit line and sharing a junction terminal with the selection transistor;
   a first coupling capacitor disposed in a first connection line coupled between the word line and the floating gate; and
   a P-N diode and a second coupling capacitor disposed in series in a second connection line coupled between the word line and the floating gate,
   wherein an anode and a cathode of the P-N diode are coupled to the second coupling capacitor and the word line, respectively, and wherein the first and second connection lines are coupled in parallel between the word line and the floating gate.

2. The NVM cell of claim 1,
wherein a program operation of the cell transistor is performed by applying a positive bias voltage to the word line;
wherein a read operation of the cell transistor is performed by applying another positive bias voltage to the word line; and
wherein an erasure operation of the cell transistor is performed by applying a negative bias voltage to the word line.

3. The NVM cell of claim 1, wherein each of the selection and the cell transistors includes a N-channel MOS transistor and a capacitance value of the first coupling capacitor is greater than a capacitance value of the second coupling capacitor.

4. A nonvolatile memory (NVM) cell array including a plurality of unit cells which are respectively located at cross points of rows distinguished by bit lines or source lines, and columns distinguished by word lines,
wherein each of the plurality of unit cells comprising:
a selection transistor configured to have a selection gate terminal coupled to a single word line of the word lines and a source terminal coupled to a single source line of the source lines;
a cell transistor configured to have a floating gate electrically isolated and a drain terminal coupled to a single bit line of the bit lines and configured to share a junction terminal with the selection transistor;
a first coupling capacitor disposed in a first connection line coupled between the selection gate terminal and the floating gate; and
a P-N diode and a second coupling capacitor disposed in series in a second connection line coupled between the selection gate terminal and the floating gate,
wherein an anode and a cathode of the P-N diode are coupled to the second coupling capacitor and the selection gate terminal, respectively, and wherein the first and second connection lines are coupled in parallel between the selection gate terminal and the floating gate.

5. The NVM cell array of claim 4,
wherein each of the selection transistor and the cell transistor is an N-channel MOS transistor,
wherein a program operation of each of the unit cells is performed by applying a positive bias voltage to the single word line;
wherein a read operation of each of the unit cells is performed by applying another positive bias voltage to the single word line; and
wherein an erasure operation of each of the unit cells is performed by applying a negative bias voltage to the single word line.

* * * * *